US012640712B2

(12) United States Patent
Liu et al.

(10) Patent No.: US 12,640,712 B2
(45) Date of Patent: May 26, 2026

(54) SEMICONDUCTOR DEVICE AND METHOD OF MONITORING A TEMPERATURE THEREOF

(71) Applicant: Taiwan Semiconductor Manufacturing Company, Ltd., Hsinchu (TW)

(72) Inventors: Szu-Lin Liu, Hsinchu (TW); Bei-Shing Lien, Taipei (TW); Yi-Wen Chen, Hsinchu (TW); Chin-Ho Chang, Hsinchu (TW); Jaw-Juinn Horng, Hsinchu (TW); Yung-Chow Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/770,826

(22) Filed: Jul. 12, 2024

(65) Prior Publication Data

US 2024/0364315 A1     Oct. 31, 2024

Related U.S. Application Data

(63) Continuation of application No. 17/718,456, filed on Apr. 12, 2022, now Pat. No. 12,068,747.

(Continued)

(51) Int. Cl.
    *H03K 3/011*     (2006.01)
    *H03F 3/45*      (2006.01)
(52) U.S. Cl.
    CPC ......... *H03K 3/011* (2013.01); *H03F 3/45475* (2013.01)

(58) Field of Classification Search
    CPC ......... G01K 7/01; G01K 3/005; G01K 7/425; G01K 7/00; G01K 7/16; G01K 1/00;
    (Continued)

(56) References Cited

U.S. PATENT DOCUMENTS 9,039,278 B2    5/2015  Chuang et al.
10,042,378 B2   8/2018  Mladenova
                (Continued)

FOREIGN PATENT DOCUMENTS

CN        1535499 A   * 10/2004  ............. H03K 3/011
CN      101989940       3/2011
                (Continued)

OTHER PUBLICATIONS

Taiwanese Office Action; Application No. 111123254; Dated Feb. 24, 2023.

(Continued)

*Primary Examiner* — Lincoln D Donovan
*Assistant Examiner* — James G Yeaman
(74) *Attorney, Agent, or Firm* — Jones Day

(57)     ABSTRACT

A semiconductor device includes a temperature-independent current generator that generates a reference current substantially independent of temperature and a mirror current that is a substantial duplicate of the reference current, a pulse signal generator that samples the mirror current so as to generate a pulse signal, and a counter that obtains a number of pulse signals generated by the pulse signal generator, that permits the pulse signal generator to generate a pulse signal when it is determined thereby that the number of pulse signals obtained thereby is less than a predetermined threshold value, and that inhibits the pulse signal generator from generating a pulse signal when it is determined thereby that the number of pulse signals obtained thereby is equal to the (Continued)

100

N1 — $V_{DD}$    $V_{SS}$ — N2

| Temperature-independent current generator | $I_{MIRROR1}$ | First pulse signal generator | PS1 | | SWITCH1 | CHOP1 CHOP2 | First counter | | DC1 |

110

$I_{MIRROR2}$, $I_{MIRROR3}$ $V_{REF}$ — 140    160    RESET

Reference voltage generator — 130

$V_{REF}$ — 150    170

| Temperature-dependent current generator | $I_{TD}$ | Second pulse signal generator | PS2 | Second counter | | DC2 |

120

SWITCH2 predetermined threshold value. A method for monitoring a temperature of the semiconductor device is also disclosed.

20 Claims, 15 Drawing Sheets

Related U.S. Application Data

(60) Provisional application No. 63/232,239, filed on Aug. 12, 2021.

(58) Field of Classification Search
CPC ...... G01K 1/02; G01K 13/00; G01K 2219/00; G01K 7/34; G01K 2215/00; G01K 7/015; G01K 7/42; H03F 2200/468; H03F 3/45475; H03K 3/011; H03K 3/57; H03K 5/00006; H03K 5/003; H03K 5/24; H03K 6/04; G01R 19/16585; G01R 31/2874; G05F 1/463; G05F 3/16; G05F 3/225; G05F 3/245; G05F 3/247; G05F 3/267; G05F 3/30; G05F 3/262
See application file for complete search history.

(56) References Cited

U.S. PATENT DOCUMENTS

| | | | | |
|---|---|---|---|---|
| 10,151,644 | B2 | 12/2018 | Hsu et al. | |
| 10,191,507 | B1 | 1/2019 | Kim et al. | |
| 10,667,350 | B2 | 5/2020 | Cusey et al. | |
| 2007/0001744 | A1* | 1/2007 | Miranda | G01K 7/01 |
| | | | | 327/512 |
| 2016/0070294 | A1* | 3/2016 | Chung | G09G 5/12 |
| | | | | 331/8 |
| 2016/0265983 | A1 | 9/2016 | Hsu et al. | |
| 2018/0149526 | A1* | 5/2018 | Abughazaleh | G01K 7/16 |

FOREIGN PATENT DOCUMENTS

| | | |
|---|---|---|
| CN | 105406837 | 3/2016 |
| TW | I664516 | 7/2019 |

OTHER PUBLICATIONS

Chinese Office Action; Application No. 202210731046.5; Dated Dec. 24, 2025.

* cited by examiner

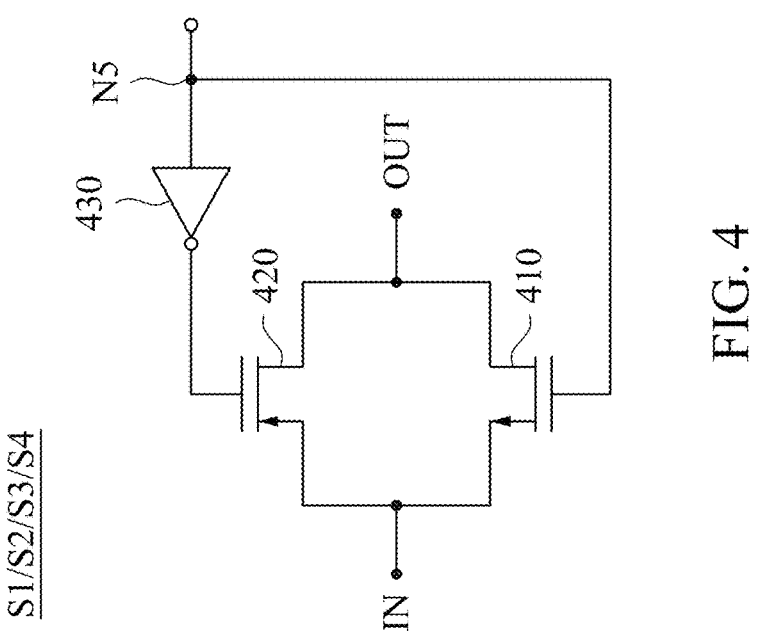
FIG. 4
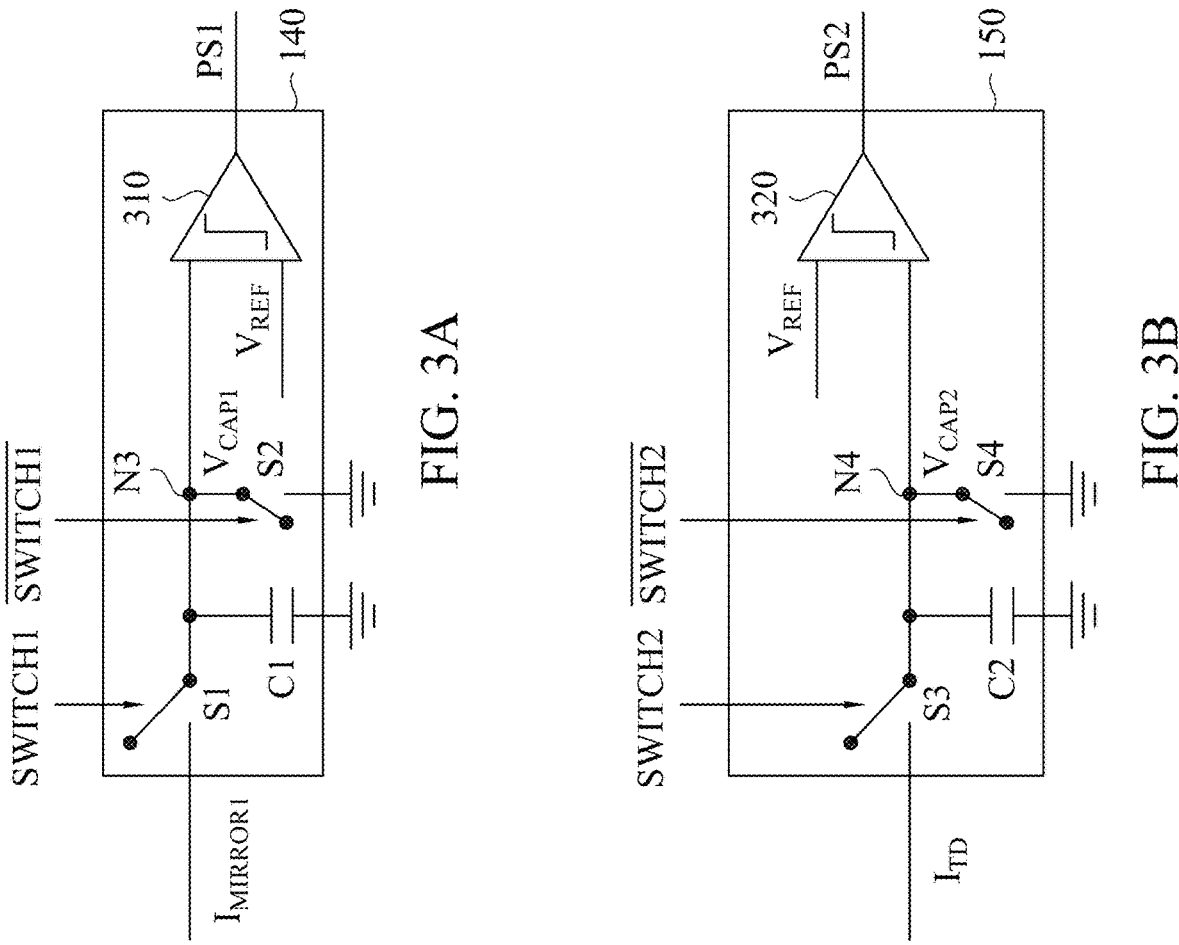
FIG. 3A
FIG. 3B

SEMICONDUCTOR DEVICE AND METHOD OF MONITORING A TEMPERATURE THEREOF

PRIORITY CLAIM

This application is a continuation of U.S. application Ser. No. 17/718,456, filed on Apr. 12, 2022, which claims priority to U.S. Provisional Application No. 62/232,239, filed Aug. 12, 2021, the contents of which are incorporated herein by reference in its entirety.

BACKGROUND

A semiconductor device, such as an integrated circuit (IC), is specified to operate within a temperature range. Generally, if a semiconductor device operates at high speed, the amount of heat generated thereby increases.

BRIEF DESCRIPTION OF THE DRAWINGS

Aspects of the present disclosure are best understood from the following detailed description when read with the accompanying figures:

FIG. 3A is a schematic circuit diagram illustrating an exemplary first pulse signal generator in accordance with various embodiments of the present disclosure;

FIG. 3B is a schematic circuit diagram illustrating an exemplary second pulse signal generator in accordance with various embodiments of the present disclosure;

FIG. 4 is a schematic circuit diagram illustrating an exemplary switch in accordance with various embodiments of the present disclosure;

DETAILED DESCRIPTION

Figure 1:
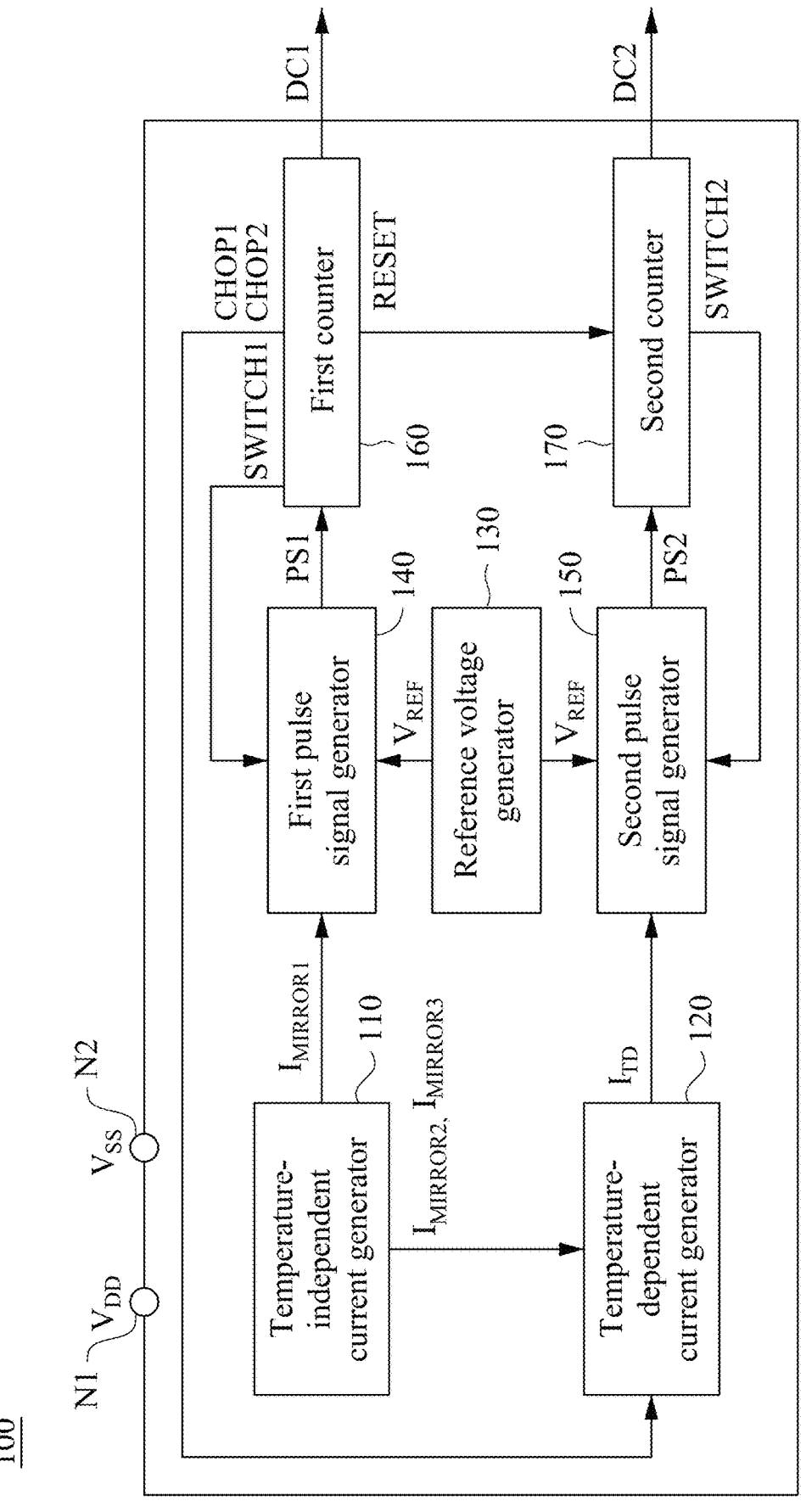
FIG. 1 is a schematic block diagram illustrating an exemplary semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A semiconductor device, such as an integrated circuit (IC), is specified to operate within a temperature range. Generally, if a semiconductor device operates at high speed, the amount of heat generated thereby increases. If the amount of heat increases beyond the specified temperature range, characteristics of the semiconductor device changes in ways that may adversely affect the performance and reliability thereof. It is may therefore be desirable to monitor a temperature of a semiconductor device. A thermal sensor that detects temperature and that generates a temperature-dependent current dependent of, i.e., that varies with, temperature may be embedded in a semiconductor device. An external temperature measuring instrument may thus be connected to the semiconductor device to measure a temperature thereof using the temperature-dependent current.

A thermal sensor may be implemented in a semiconductor device. The thermal sensor, in an example, detects a temperature of the semiconductor device and generates a temperature-dependent current dependent of, i.e., that varies with, temperature. The temperature-dependent current may be a proportional to absolute temperature (PTAT) current or a complementary to absolute temperature (CTAT) current. A PTAT current has a positive temperature coefficient and is thus directly proportional to the temperature. That is, a PTAT current increases with an increase in temperature. Contrary to the PTAT current, a CTAT current has a negative temperature coefficient and is thus inversely proportional to the temperature. That is, a CTAT current decreases with an increase in temperature. When it is desired to monitor a temperature of the semiconductor device using the temperature-depended current, the semiconductor device may utilize an external reference clock generator to be connected thereto. This may make monitoring of the temperature of the semiconductor device cumbersome, time consuming, and inconvenient.

Systems and methods as described herein include a semiconductor device, e.g., semiconductor device 100 in FIG. 1 in accordance with an embodiment, that may avoid connection to an external reference clock generator during monitoring of a temperature thereof. For example, the semiconductor device 100 includes a temperature-dependent current generator, e.g., temperature-dependent current generator 120 in FIG. 5, that generates a temperature-dependent current, e.g., a PTAT or CTAT current, dependent of, i.e., that varies with, temperature and includes a current mismatch correction circuit, e.g., current mismatch correction circuit 530, and a voltage offset correction circuit, e.g., voltage offset correction circuit 540, each of which facilitates generation of a relatively accurate temperature-dependent current by the temperature-dependent current generator. Instead of an external reference clock generator, a counter, e.g., counter 160 or counter 170, that generates a chop signal is included in the semiconductor device. Each of the current mismatch correction circuit 530 and the voltage offset correction circuit 540 is responsive to the chop signal for periodically reversing a polarity thereof, whereby the temperature-dependent current generator generates a relatively accurate temperature-dependent current.

In further detail, FIG. 1 is a schematic block diagram illustrating an exemplary semiconductor device 100 in accordance with various embodiments of the present disclosure. As illustrated in FIG. 1, the semiconductor device 100, e.g., an integrated circuit (IC), includes a temperature-independent current generator 110, a temperature-dependent current generator 120, a reference voltage generator 130, a first pulse signal generator 140, a second pulse signal generator 150, a first counter 160, and a second counter 170, each of which is connected between a node (N1) configured to receive a first supply voltage ($V_{DD}$) and a node (N2) configured to receive a second supply voltage (Vss), e.g., 0 V, lower than the first supply voltage ($V_{DD}$).

Figure 2:
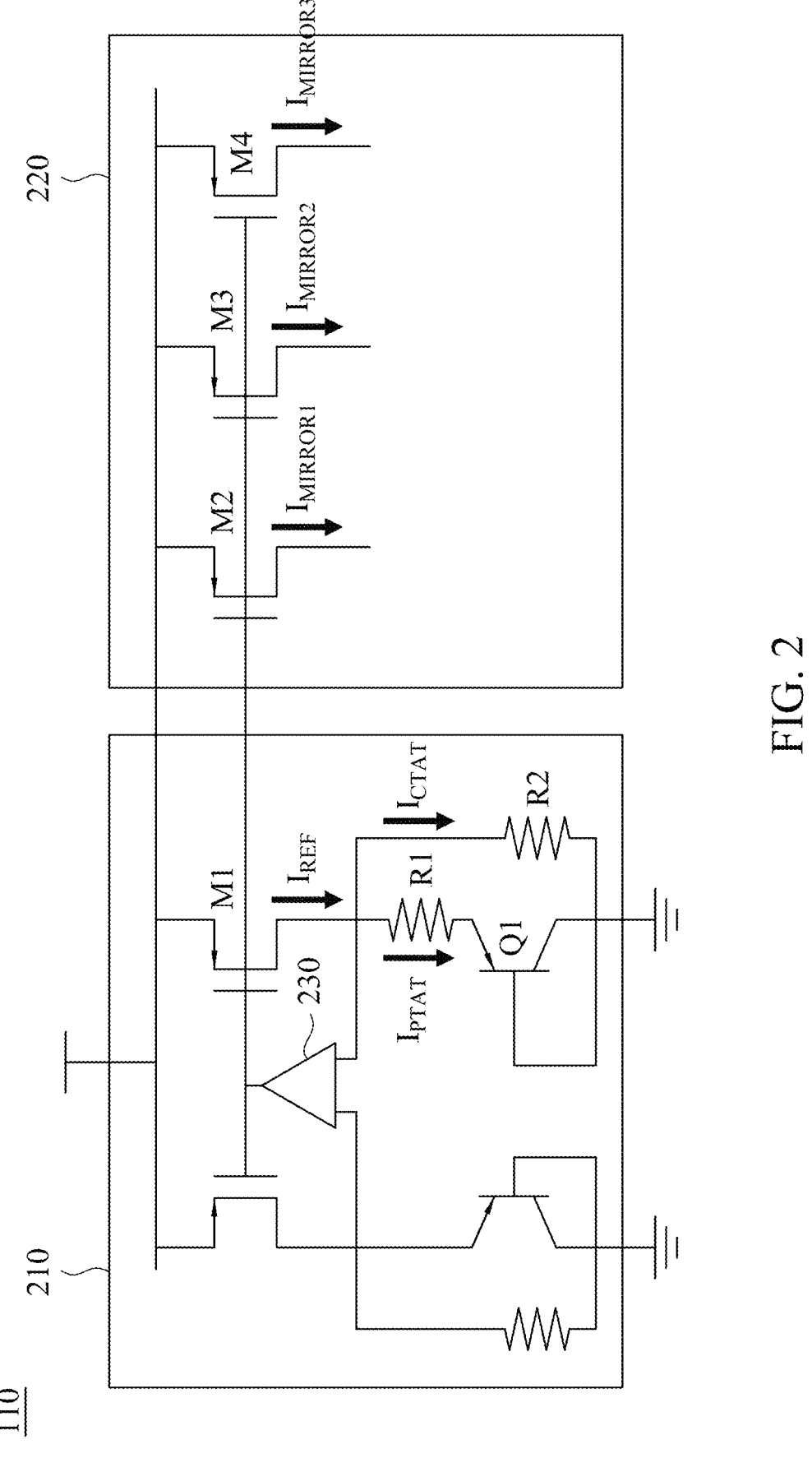
FIG. 2 is a schematic circuit diagram illustrating an exemplary temperature-independent current generator in accordance with various embodiments of the present disclosure.

The temperature-independent current generator 110 is configured to generate a reference current, e.g., reference current ($I_{REF}$) in FIG. 2, substantially independent of, i.e., that does not substantially vary with, temperature. The temperature-independent current generator 110 is further configured to generate one or more mirror currents ($I_{MIRROR1}$-$I_{MIRROR3}$) that are substantial duplicates of the reference current ($I_{REF}$).

The reference voltage generator 130 is configured to generate a reference voltage ($V_{REF}$) that, in an exemplary embodiment, is a fraction of the supply voltage ($V_{DD}$). In such an exemplary embodiment, the reference voltage generator 130 may be in the form of a voltage divider and includes a pair of resistors connected in series between the nodes (N1, N2) and a junction that is between the resistors and that provides the reference voltage ($V_{REF}$). Other configurations for the reference voltage generator 130 are used in further embodiments.

The first pulse signal generator 140 is connected to the temperature-independent current generator 110 and the reference voltage generator 130 and is configured to sample the mirror current ($I_{MIRROR1}$) using the reference voltage ($V_{REF}$) so as to generate a pulse signal (PS1).

The first counter 160 is connected to the first pulse signal generator 140 and is configured to count/obtain the number of pulse signals (PS1) generated by the first pulse signal generator 140. The first counter 160 is further configured to output a digital code (DC1), i.e., series of 1's and 0's, indicative of the number of pulse signals (PS1) obtained thereby. It is noted that the digital code (DC1) of the first counter 160 and a digital code (DC2) of the second counter 170 may be used by an external temperature measuring instrument, e.g., external temperature measuring instrument 1200 in FIG. 12, coupled to the semiconductor device 100 to measure a temperature of the semiconductor device 100.

The first counter 160 is further configured to determine whether the number of pulse signals (PS1) obtained thereby is less than or equal to a predetermined threshold value, to permit the first pulse signal generator 140 to generate a pulse signal when it is determined thereby that the number of pulse signals (PS1) obtained thereby is less than the predetermined threshold value, and to inhibit the first pulse signal generator 140 from generating a pulse signal when it is determined thereby that the number of pulse signals (PS1) obtained thereby is equal to the predetermined threshold value.

The temperature-dependent current generator 120 is connected to the temperature-independent current generator 110 and is configured to generate a temperature-dependent current ($I_{TD}$) dependent of, i.e., that varies with, temperature based on the mirror currents ($I_{MIRROR2}$, $I_{MIRROR3}$). In this exemplary embodiment, the temperature-dependent current ($I_{TD}$) increases with an increase in the temperature of the semiconductor device 100 and may thus be referred to as a PTAT current. In an alternative embodiment, the temperature-dependent current ($I_{TD}$) decreases with an increase in the temperature of the semiconductor device 100 and may thus be referred to as a CTAT current.

The second pulse signal generator 150 is connected to the temperature-dependent current generator 120 and the reference voltage generator 130 and is configured to sample the temperature-dependent current ($I_{TD}$) using the reference voltage ($V_{REF}$) so as to generate a pulse signal (PS2).

The second counter 170 is connected to the second pulse signal generator 150 and the first counter 160 and is configured to count/obtain the number of pulse signals (PS2) generated by second pulse signal generator 150. The second counter 170 is further configured to output at a digital code (DC2), i.e., series of 1's and 0's, indicative of the number of pulse signals (PS2) obtained thereby. As mentioned above, the semiconductor device 100 may be coupled to an external temperature measuring instrument, e.g., external temperature measuring instrument 1200 in FIG. 12, to measure a temperature thereof using the digital codes (DC1, DC2).

Example supporting circuitry for the temperature-independent current generator 110 are depicted in FIG. 2. It is understood that these circuitry are provided by way of example, not by limitation, and other suitable temperature-independent current generator 110 circuitry are within the scope of the present disclosure. FIG. 2 is a schematic circuit diagram illustrating an exemplary temperature-independent current generator 110 in accordance with various embodiments of the present disclosure. As illustrated in FIG. 2, the temperature-independent current generator 110 is in the form of a bandgap circuit and includes a reference current generating circuit 210 and a current mirroring circuit 220. The reference current generating circuit 210 is configured to generate a reference current ($I_{REF}$) and includes an operational amplifier 230, transistors (M1, Q1), and resistors R1, R2. The current mirroring circuit 220 is connected to the reference current generating circuit 210, is configured to generate one or more mirror currents ($I_{MIRROR1}$-$I_{MIRROR3}$) that are substantial duplicates of the reference current ($I_{REF}$) (e.g., within 1%, 5%, 10%), and includes one or more transistors (M2-M4).

In operation, after a startup, the operational amplifier 230 forces input voltages at op-amp inputs thereof to be substantially equal to each other. Consequently, an output at an op-amp output of the operational amplifier 230 transitions from a high signal level to a low signal level. This activates transistors (M1, Q1). As a result, a PTAT current ($I_{PTAT}$) flows through the resistor (R1) and the transistor (Q1) and a CTAT current flows through resistor (R2). As illustrated in FIG. 2, the CTAT current ($I_{CTAT}$) is added to the PTAT current ($I_{PTAT}$), whereby the reference current generating circuit 210 generates the reference current ($I_{REF}$). Because the transistor (M2-M4) is connected in parallel with the transistor (M1), a mirror current ($I_{MIRROR1}$-$I_{MIRROR3}$) that is a substantial duplicate of the reference current ($I_{REF}$) flows through the transistor (M2-M4).

Example supporting circuitry for the first and second pulse signal generators 140, 150 are depicted in FIGS. 3A and 3B, respectively. It is understood that these circuitry are provided by way of example, not by limitation, and other suitable first pulse signal generator 140 circuitry and second pulse signal generator 150 circuitry are within the scope of the present disclosure. FIG. 3A is a schematic circuit diagram illustrating exemplary first pulse signal generator 140 in accordance with various embodiments of the present disclosure. FIG. 3B is a schematic circuit diagram illustrating exemplary second pulse signal generator 150 in accordance with various embodiments of the present disclosure. As illustrated in FIG. 3A, the first pulse signal generator 140 includes a first switch (S1), a second switch (S2), a capacitor (C1), and a comparator 310. The first and second switches (S1, S2) are responsive to a switch signal (SWITCH1) from the first counter 160 for controlling switching activities thereof, in a manner that will be described below. Although not shown, an inverter is connected between the first counter 160 and the second switch (S2). As such, when the switch signal (SWITCH1) at the first switch (S1) is at a high/low signal level, a complement of the switch signal (SWITCH1), i.e., a low/high signal level, is at the second switch (S2) and vice versa.

The first switch (S1) has a first switch terminal connected to the temperature-independent current generator 110, a second switch terminal connected to node (N3), and a third switch terminal configured to receive the switch signal (SWITCH1). The second switch (S2) has a first switch terminal connected to the node (N2), a second switch terminal connected to the node (N3), and a third switch terminal configured to receive a complement of the switch signal (SWITCH1).

The capacitor (C1) is connected in parallel with the second switch (S2). The comparator 310 has a first comparator input connected to the node (N3), a second comparator input connected to the reference voltage generator 130, and a comparator output connected to the first counter 160.

As illustrated in FIG. 3B, the second pulse signal generator 140 includes a first switch (S3), a second switch (S4), a capacitor (C2), and a comparator 320. The first and second switches (S3, S4) are responsive to a switch signal (SWITCH2) from the second counter 170 for controlling switching activities thereof, in a manner that will be described below. Although not shown, an inverter is connected between the second counter 170 and the second switch (S4). As such, when the switch signal (SWITCH2) at the first switch (S3) is at a high/low signal level, a complement of the switch signal (SWITCH2), i.e., a low/high signal level, is at the second switch (S4) and vice versa.

The first switch (S3) has a first switch terminal connected to the temperature-dependent current generator 120, a second switch terminal connected to node (N4), and a third switch terminal configured to receive the switch signal (SWITCH2). The second switch (S4) has a first switch terminal connected to the node (N2), a second switch terminal connected to the node (N4), and a third switch terminal configured to receive a complement of the switch signal (SWITCH2).

The capacitor (C2) is connected in parallel with the second switch (S4). The comparator 320 has a first comparator input connected to the node (N4), a second comparator input connected to the reference voltage generator 130, and a comparator output connected to the second counter 170.

In operation, the pulse signal generator 140, 150 receives a switch signal (SWITCH1, SWITCH2) that has a high signal level, thereby activating the first switch (S1, S3) and, at substantially the same time, deactivating the second switch (S2, S4), this charges the capacitor (C1, C2). This, in turn, causes a capacitor voltage ($V_{CAP1}$, $V_{CAP2}$) appearing at the node (N3, N4) to increase. When the capacitor voltage ($V_{CAP1}$, $V_{CAP2}$) increases to substantially equal to the reference voltage ($V_{REF}$), the pulse signal (PS1, PS2) at the comparator output of the comparator 310, 320 transitions from a low signal level to a high signal level. Thereafter, the pulse signal generator 140, 150 receives a switch signal (SWITCH1, SWITCH2) that has a low signal level, thereby deactivating the first switch (S1, S3) and, at substantially the same time, activating the second switch (S2, S4). This discharges the capacitor (C1, C2). This, in turn, causes a capacitor voltage ($V_{CAP1}$, $V_{CAP2}$) appearing at the node (N3, N4) to decrease. When the capacitor voltages ($V_{CAP1}$, $V_{CAP2}$) decreases to less than the reference voltage ($V_{REF}$), the pulse signal (PS1, PS2) at the comparator output of the comparator 310, 320 transitions from the high signal level back to the low signal level, whereby the pulse signal generator 140, 150 generates a pulse signal (PS1, PS2).

In an exemplary embodiment, at least one of the switches (S1-S4) has a configuration shown in FIG. 4. Other configurations for the switch (S1-S4) are used in further embodiments. FIG. 4 is a schematic circuit diagram illustrating an exemplary switch (S1-S4) in accordance with various embodiments of the present disclosure. As illustrated in FIG. 4, the switch (S1-S4) is in the form of a transmission gate and includes an N-type Metal Oxide Semiconductor (NMOS) transistor 410, a P-type MOS transistor (PMOS) 420 that is connected in parallel with the NMOS transistor 410, an input node (IN) that is connected between a source of the NMOS transistor 410 and a source of the PMOS transistor 420 and that serves as the first switch terminal of the switch (S1-S4), and an output node (OUT) that is connected between a drain of the NMOS transistor 410 and a drain of the PMOS transistor 420 and that serves as the second switch terminal of the switch (S1-S4). A node (N5), which serves as the third switch terminal of the switch (S1-S4), is connected to a gate of the NMOS transistor 410. An inverter 430 is connected between the node (N5) and a gate of the PMOS transistor 420. As such, when a switch signal at the node (N5) (i.e., at the third switch terminal of the switch S1-S4) is at a high signal level, both the NMOS and PMOS transistors 410, 420 are activated and a low resistance path exists between input and output nodes (IN, OUT) (i.e., between the first and second switch terminals of the switch S1-S4).

On the other hand, when a switch signal at the node (N5) (i.e., at the third switch terminal of the switch S1-S4) is at a low signal level, both the NMOS and PMOS transistors 410, 420 are deactivated and a high resistance path exists between input and output nodes (IN, OUT) (i.e., between first and second switch terminals of the switch S1-S4).

Figure 5:
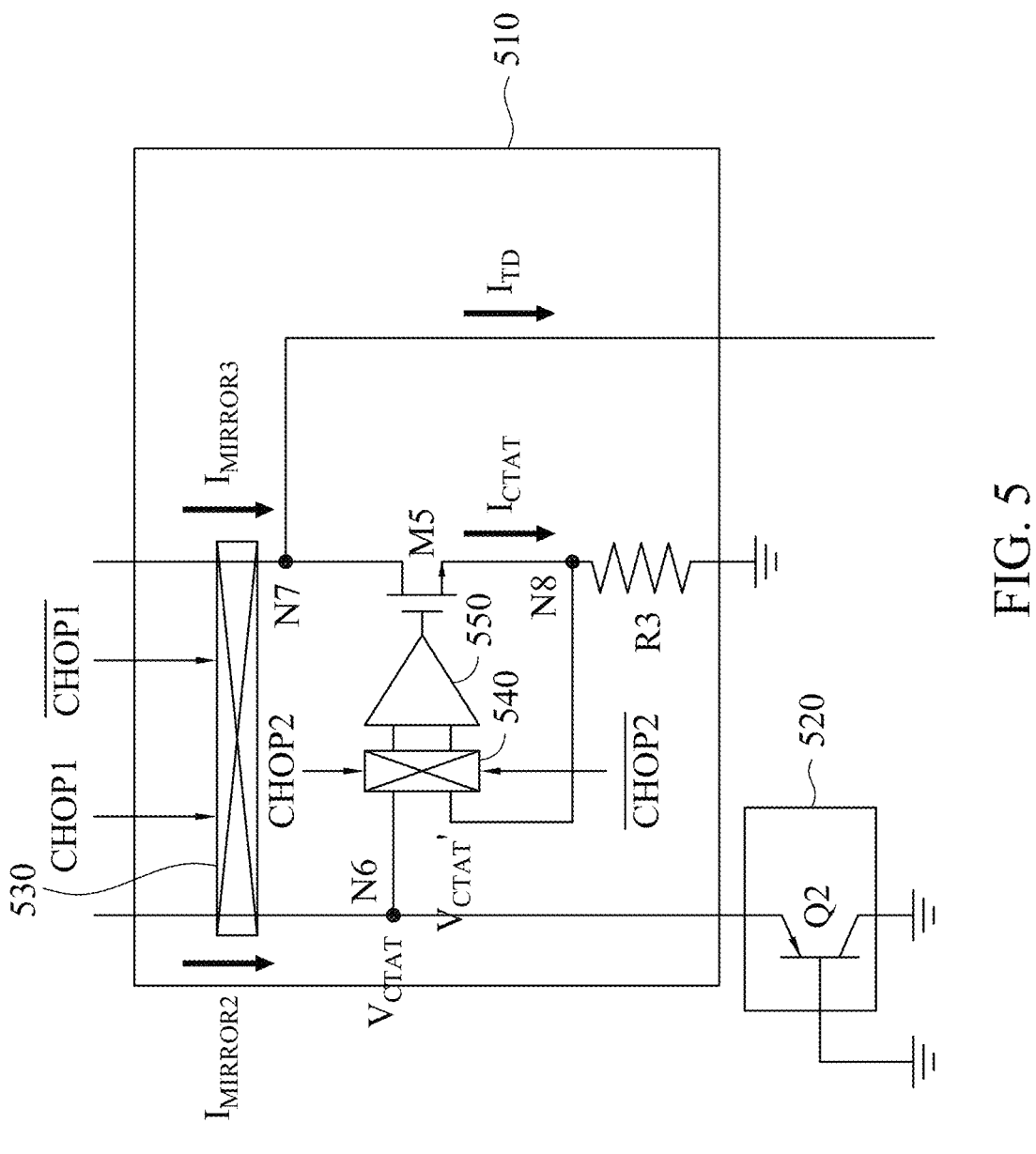
FIG. 5 is a schematic circuit diagram illustrating an exemplary temperature-dependent current generator in accordance with various embodiments of the present disclosure.

Example supporting circuitry for the temperature-dependent current generator 120 are depicted in FIG. 5. It is understood that these circuitry are provided by way of example, not by limitation, and other temperature-dependent current generator 120 circuitry are within the scope of the present disclosure. FIG. 5 is a schematic circuit diagram illustrating an exemplary temperature-dependent current generator 120 in accordance with various embodiments of the present disclosure. As illustrated in FIG. 5, the temperature-dependent current generator 120 includes a current extractor 510 and a thermal sensor 520. The current extractor 510 is configured to extract the temperature-dependent current ($I_{TD}$), i.e., a PTAT current, from the mirror current ($I_{MIRROR3}$) and includes a current mismatch correction circuit 530, a voltage offset correction circuit 540, an operational amplifier 550, a transistor (M5), and a resistor (R3). The current mismatch correction circuit 530 has positive and negative inputs connected to drains of the transistors (M3, M4) of the temperature-independent current generator 110, respectively, and positive and negative outputs connected to nodes (N6, N7), respectively.

The voltage offset correction circuit 540 has a positive input connected to the node (N6) and a negative input connected to a node (N8). The voltage offset correction circuit 540 further has positive and negative outputs connected to first and second op-amp inputs of the operational amplifier 550, respectively. An op-amp output of the operational amplifier 550 is connected to a gate of the transistor (M5). The transistor (M5) has a source connected to the node (N8). The resistor (R3) has a substantially zero temperature coefficient and is connected between the node (N2) and the node (N8). In this exemplary embodiment, the thermal sensor 520 includes a transistor (Q2) that has a negative temperature coefficient and that includes a source connected to the node (N6) and a gate and a drain connected to each other and to the node (N2).

In operation, with reference to FIG. 5, the thermal sensor 520 detects a temperature of the semiconductor device 100. Meanwhile, the mirror currents ($I_{MIRROR2}$, $I_{MIRROR3}$) flow from the transistors (M3, M4) to the nodes (N6, N7), respectively, through the current mismatch correction circuit 530. Because the transistor (Q2) has a negative temperature coefficient, i.e., a voltage across the transistor (Q2) is inversely proportional to temperature, a first input voltage ($V_{CTAT}$) appears at the first op-amp input of the operational amplifier 550. Next, the operational amplifier 550 converts the first input voltage ($V_{CTAT}$) into a CTAT current ($I_{CTAT}$) that flows through the resistor (R3) and transistor (M5), whereby a second input voltage ($V_{CTAT}'$) appears at the second op-amp input of the operational amplifier 550. As illustrated in FIG. 5, the CTAT current ($I_{CTAT}$) is subtracted from the mirror current ($I_{MIRROR3}$), whereby the current extractor 510 extracts the temperature-dependent current ($I_{TD}$), i.e., a PTAT current, from the mirror current ($I_{MIRROR3}$).

Figure 6:
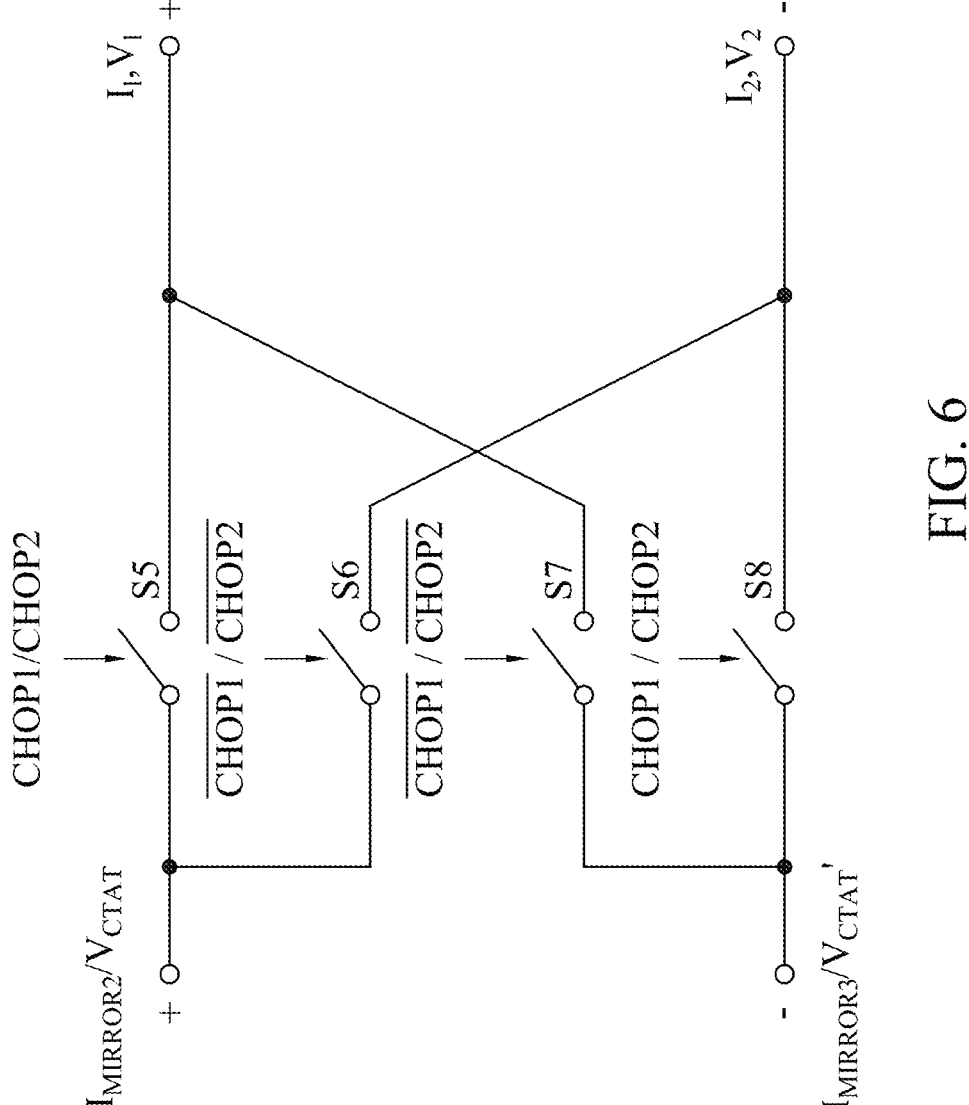
FIG. 6 is a schematic circuit diagram illustrating an exemplary current mismatch correction circuit/voltage offset correction circuit in accordance with various embodiments of the present disclosure.

Ideally, the mirror currents ($I_{MIRROR2}$, $I_{MIRROR3}$) flowing through the transistors (M3, M4) are equal to each other. However, due to process variation, transistor aging, and the like, threshold voltages, for instance, of the transistors (M3, M4) may differ from each other. Consequently, even if the transistors (M3, M4) may have substantially the same size, i.e., substantially equal W/L ratio, the mirror currents ($I_{MIRROR2}$, $I_{MIRROR3}$) may still be mismatched considerably. The current mismatch correction circuit 530 is configured to reduce such a current mismatch therebetween. For example, in an exemplary embodiment, the current mismatch correction circuit 530 has a configuration shown in FIG. 6. Other configurations for the current mismatch correction circuit 530 are used in further embodiments. FIG. 6 is a schematic circuit diagram illustrating an exemplary current mismatch correction circuit 530 in accordance with various embodiments of the present disclosure. As illustrated in FIG. 6, the current mismatch correction circuit 530 is responsive to a chop signal (CHOP1) that transitions between high and low signal levels from the first counter 160 for reducing a current mismatch between the mirror currents ($I_{MIRROR2}$, $I_{MIRROR3}$), in a manner that will be described hereinafter. For example, when the chop signal (CHOP1) is at a high signal level, i.e., when the switches (S5, S8) are activated and the switches (S6, S7) are deactivated, the positive input of the current mismatch correction circuit 530 is connected to the positive output of the current mismatch correction circuit 530 and the negative input of the current mismatch correction circuit 530 is connected to the negative input of the current mismatch correction circuit 530. As such, the value of the current (11) at the positive output of the current mismatch correction circuit 530 is the value of the mirror current ($I_{MIRROR2}$) at the positive input of the current mismatch correction circuit 530 and the value of the current ($I_2$) at the negative output of the current mismatch correction circuit 530 is the value of the mirror current ($I_{MIRROR3}$) at the negative input of the current mismatch correction circuit 530.

On the other hand, when the chop signal (CHOP1) is at a low signal level, i.e., when the switches (S5, S8) are deactivated and the switches (S6, S7) are activated, the positive input of the current mismatch correction circuit 530 is connected to the negative output of the current mismatch correction circuit 530 and the negative input of the current mismatch correction circuit 530 is connected to the positive output of the current mismatch correction circuit 530. As such, the value of the current ($I_1$) at the positive output of the current mismatch correction circuit 530 is the value of the mirror current ($I_{MIRROR3}$) at the negative input of the current mismatch correction circuit 530 and the value of the current ($I_2$) at the negative output of the current mismatch correction circuit 530 is the value of the mirror current ($I_{MIRROR2}$) at the positive input of the current mismatch correction circuit 530. That is, by periodically reversing a polarity of the current mismatch correction circuit 530, the average value of the current ($I_1$) eventually ends up being the average value of the mirror currents ($I_{MIRROR2}$, $I_{MIRROR3}$). Likewise, the average value of the current ($I_2$) eventually ends up being the average value of the mirror currents ($I_{MIRROR2}$, $I_{MIRROR3}$). Accordingly, while a current mismatch occurs between the mirror currents ($I_{MIRROR2}$, $I_{MIRROR3}$), the averages of the currents ($I_1$, $I_2$) can be made equal to each other, whereby such a current mismatch is reduced, if not eliminated, by the current mismatch correction circuit 530.

Ideally, the input voltages ($V_{CTAT}$, $V_{CTAT}'$) at the op-amp inputs of the operational amplifier 550 are equal to each other. However, due to process variation, transistor aging, and the like, threshold voltages, for instance, of input transistors of the operational amplifier 550 may differ from each other. Consequently, even if the input transistors may have substantially the same size, i.e., substantially equal W/L ratio, voltage offset between the input voltages ($V_{CTAT}$, $V_{CTAT}'$) may still be considerably high. The voltage offset correction circuit 540 is configured to reduce such a voltage offset. For example, in an exemplary embodiment, the voltage offset correction circuit 540 has a configuration shown in FIG. 6. Other configurations for the voltage offset correction circuit 540 are used in further embodiments. FIG. 6 is a schematic circuit diagram illustrating a voltage offset correction circuit 540 in accordance with various embodiments of the present disclosure. As illustrated in FIG. 6, the voltage offset correction circuit 540 is responsive to a chop signal (CHOP2) that transitions between high and low signal levels from the first counter 160 for reducing a voltage offset between the input voltages ($V_{CTAT}$, $V_{CTAT}'$), in a manner that will be described hereinafter. For example, when the chop signal (CHOP2) is at a high signal level, i.e., when the switches (S5, S8) are activated and the switches (S6, S7) are deactivated, the positive input of the voltage offset correction circuit 540 is connected to the positive output of the voltage offset correction circuit 540 and the negative input of the voltage offset correction circuit 540 is connected to the negative output of the voltage offset correction circuit 540. As such, the value of the voltage ($V_1$) at the positive output of the current mismatch correction circuit 530 is the value of the input voltage ($V_{CTAT}$) at the positive input of the voltage offset correction circuit 540 and the value of the voltage ($V_2$) at the negative output of the voltage offset correction circuit 540 is the value of the input voltage ($V_{CTAT}'$) at the negative input of the voltage offset correction circuit 540.

On the other hand, when the chop signal (CHOP2) is at a low signal level, i.e., when the switches (S5, S8) are deactivated and the switches (S6, S7) are activated, the positive input of the voltage offset correction circuit 540 is connected to the negative output of the voltage offset correction circuit 540 and the negative input of the voltage offset correction circuit 540 is connected to the positive output of the voltage offset correction circuit 540. As such, the value of the voltage ($V_1$) at the positive output of the voltage offset correction circuit 540 is the value of the input voltage ($V_{CTAT}'$) at the negative input of the voltage offset correction circuit 540 and the value of the voltage ($V_2$) at the negative output of the voltage offset correction circuit 540 is the value of the input voltage ($V_{CTAT}$) at the positive input of the voltage offset correction circuit 540. That is, by periodically reversing a polarity of the voltage offset correction circuit 530, the average value of the voltage ($V_1$) eventually ends up being is the average value of the input voltages ($V_{CTAT}$, $V_{CTAT}'$). Likewise, the average value of the current ($V_2$) eventually ends up being the average value of the input voltages ($V_{CTAT}$, $V_{CTAT}'$). Accordingly, while a voltage offset occurs between the input voltages ($V_{CTAT}$, $V_{CTAT}'$), the averages of the voltage ($V_1$, $V_2$) can be made equal to each other, whereby such a voltage offset is reduced, if not eliminated, by the voltage offset correction circuit 540.

Figure 7:
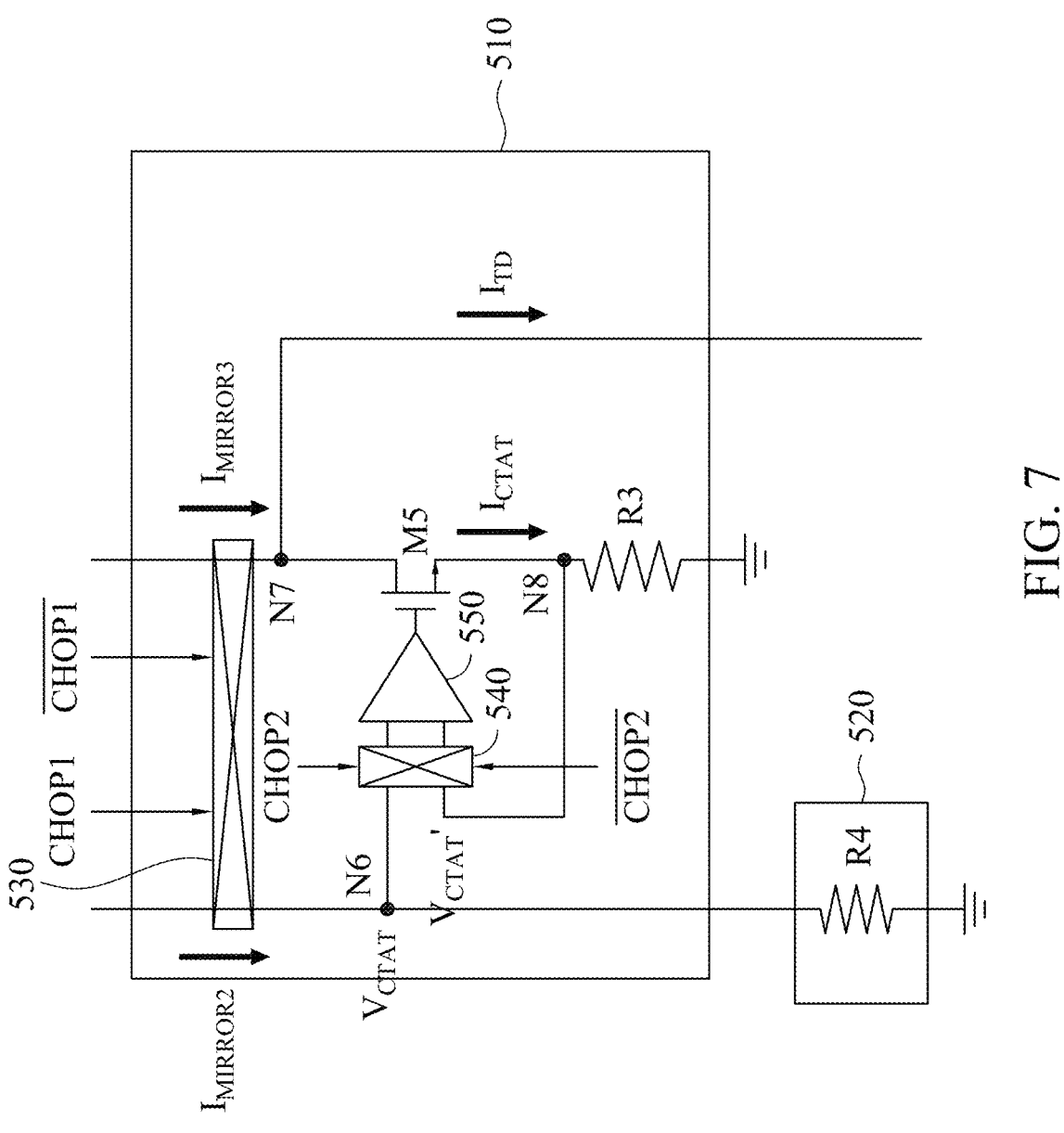
FIG. 7 is a schematic circuit diagram illustrating another exemplary temperature-dependent current generator in accordance with various embodiments of the present disclosure.

FIG. 7 is a schematic circuit diagram illustrating another exemplary temperature-dependent current generator 700 in accordance with various embodiments of the present disclosure. The temperature-dependent current generator 700 differs from the temperature-dependent current generator 120 in that the thermal sensor 520 of the temperature-dependent current generator 700 includes a resistor (R4) that has a negative temperature coefficient and that is connected between the nodes (N2, N6). In an alternative embodiment, the thermal sensor 520 of the temperature-dependent current generator 700 includes a diode that has a negative temperature coefficient and that is connected between the nodes (N2, N6).

In operation, with reference to FIG. 7, the thermal sensor 520 detects a temperature of the semiconductor device 100. Meanwhile, the mirror currents ($I_{MIRROR2}$, $I_{MIRROR3}$) flow from the transistors (M3, M4) to the nodes (N6, N7), respectively, through the current mismatch correction circuit 530. Because the resistor (R4) has a negative temperature coefficient, i.e., a voltage across the resistor (R4) is inversely proportional to temperature, a first input voltage ($V_{CTAT}$)

appears at the first op-amp input of the operational amplifier 550. Next, the operational amplifier 550 converts the first input voltage ($V_{CTAT}$) into a CTAT current ($I_{CTAT}$) that flows through the transistor (M5) and the resistor (R3), whereby a second input voltage ($V_{CTAT}'$) appears at the second op-amp input of the operational amplifier 550. As illustrated in FIG. 7, the CTAT current ($I_{CTAT}$) is subtracted from the mirror current ($I_{MIRROR3}$), whereby the current extractor 510 extracts the temperature-dependent current ($I_{TD}$), i.e., a PTAT current, from the mirror current ($I_{MIRROR3}$).

Figure 8:
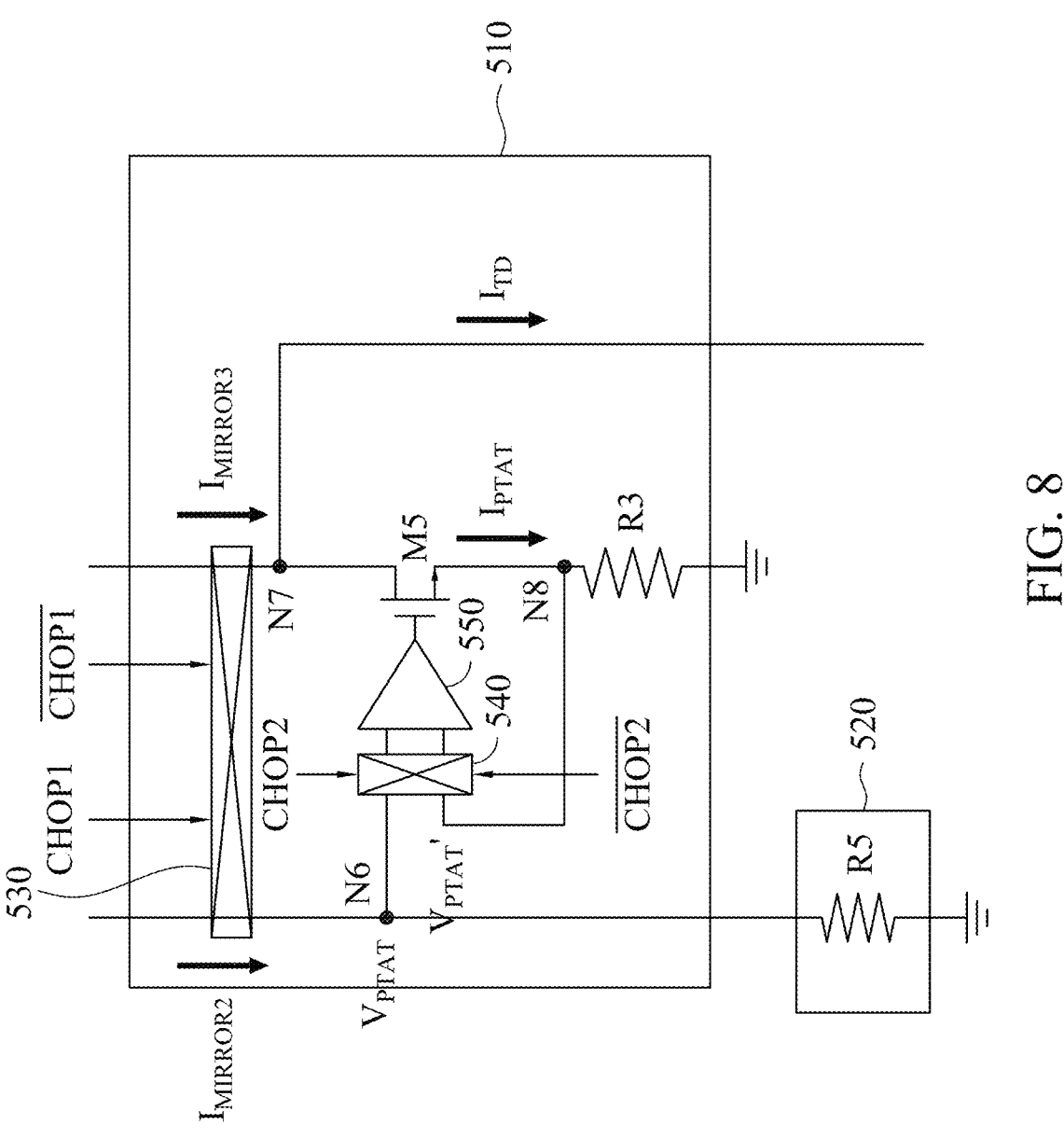
FIG. 8 is a schematic circuit diagram illustrating another exemplary temperature-dependent current generator in accordance with various embodiments of the present disclosure.

FIG. 8 is a schematic circuit diagram illustrating another exemplary temperature-dependent current generator 800 in accordance with various embodiments of the present disclosure. The temperature-dependent current generator 800 of this embodiment differs from the temperature-dependent current generator 120 in that the current extractor 510 of the temperature-dependent current generator 800 is configured to subtract the PTAT current from the mirror current ($I_{MIRROR3}$) so as to extract the temperature-dependent current ($I_{TD}$), i.e., a CTAT current, from the mirror current ($I_{MIRROR3}$). The thermal sensor 520 of the temperature-dependent current generator 800 includes a resistor (R5) that has a positive temperature coefficient and that is connected between the nodes (N2, N6).

In operation, with reference to FIG. 8, the thermal sensor 520 detects a temperature of the semiconductor device 100. Meanwhile, the mirror currents ($I_{MIRROR2}$, $I_{MIRROR3}$) flow from the transistor (M3, M4) to the nodes (N6, N7), respectively, through the current mismatch correction circuit 530. Because the resistor (R5) has a positive temperature coefficient, i.e., a voltage across the resistor (R6) is directly proportional to temperature, a first input voltage ($V_{PTAT}$) appears at the first op-amp input of the operational amplifier 550. Next, the operational amplifier 550 converts the first input voltage ($V_{PTAT}$) into a PTAT current ($I_{PTAT}$) that flows through the resistor (R5) and the transistor (M5), whereby a second input voltage ($V_{PTAT}'$) appears at the second op-amp input of the operational amplifier 550. As illustrated in FIG. 8, the PTAT current ($I_{PTAT}$) is subtracted from the mirror current ($I_{MIRROR3}$), whereby the current extractor 510 extracts the temperature-dependent current ($I_{TD}$), i.e., a CTAT current, from the mirror current ($I_{MIRROR3}$).

Figure 9:
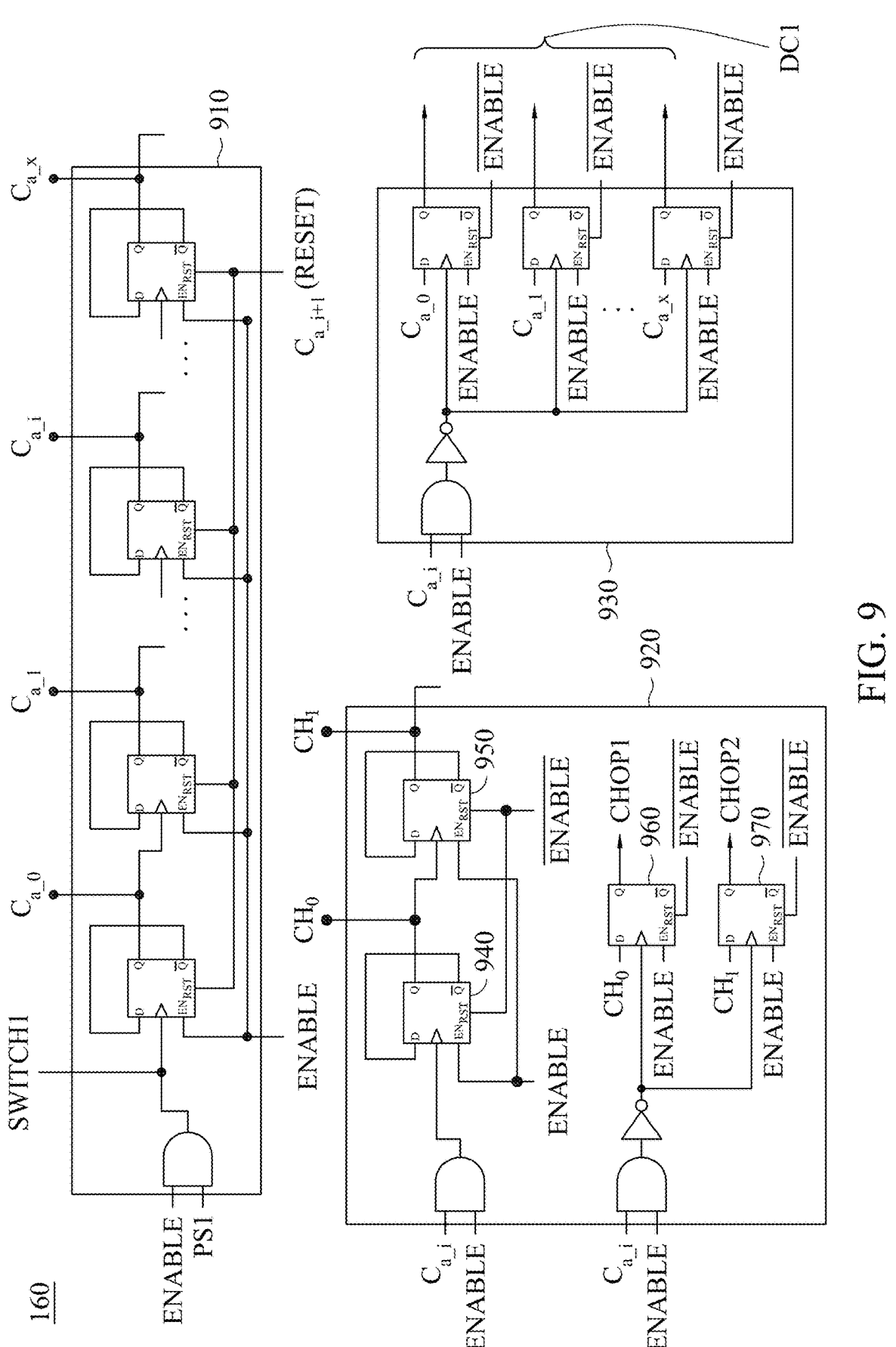
FIG. 9 is a schematic circuit diagram illustrating an exemplary first counter in accordance with various embodiments of the present disclosure.

Example supporting circuitry for the first counter 160 are depicted in FIG. 9. It is understood that these circuitry are provided by way of example, not by limitation, and other first counter 160 circuitry are within the scope of the present disclosure. FIG. 9 is a schematic circuit diagram illustrating an exemplary first counter 160 in accordance with various embodiments of the present disclosure. As illustrated in FIG. 9, the first counter 160 includes a first counter portion 910, a second counter portion 920, and a third counter portion 930. The first counter portion 910 includes a plurality of flip-flops, e.g., d-type flip-flops, and an AND gate. Each of the flip-flops has an output terminal ($C_{a\_0}$-$C_{a\_X}$). The output terminal ($C_{a\_i+1}$) is connected to reset terminals of the flip-flops. The AND gate has a first input terminal connected to the pulse signal generator 140 for receiving the pulse signals (PS1) and a second input terminal configured to receive an ENABLE signal. The ENABLE signal may be provided by a circuit included in or external to the semiconductor device 100. An output terminal of the AND gate is connected to a clock terminal of a first flip-flop of the first counter portion 910 and the switches (S1, S2) of the pulse signal generator 140. The construction as such of the first counter portion 910 permits the first counter 160 to count/obtain the number of pulse signals (PS1) generated by the pulse signal generator 140, to output the number of pulse signals (PS1) obtained thereby in the form of a series of bits, and to generate the switch signal (SWITCH1) and the reset signal (RESET).

The second counter portion 920 includes first, second, third, and fourth flip-flops 940, 950, 960, 970, e.g., d-type flip-flops, an AND gate, and a NAND gate, e.g., an AND gate and an inverter connected in series. Each of the first and second flip-flops 940, 950 has an output terminal (CH0, CH1). The AND gate has a first input terminal connected to the output terminal ($C_{a\_i}$) of the first counter portion 910, a second input terminal configured to receive the ENABLE signal, and an output terminal connected to the clock terminal of the first flip-flop 940. Each of the third and fourth flip-flops 960, 970 has an input terminal connected to a respective one of the output terminal (CH0, CH1). The NAND gate has a first input terminal connected to the output terminal ($C_{a\_i}$) of the first counter portion 910, a second input terminal configured to receive the ENABLE signal, and an output terminal connected to the clock terminals of the third and fourth flip-flops 960, 970. The construction as such of the second counter portion 920 permits generation of the chop signals (CHOP1, CHOP2) by the first counter 160.

The third counter portion 930 includes a plurality of flip-flops, e.g., d-type flip-flops, and a NAND gate, e.g., an AND gate and an inverter connected in series. Each of the flip-flops has an input terminal connected to a respective one of the output terminals ($C_{a\_0}$-$C_{a\_x}$) of the first counter portion 910. The NAND gate has a first input terminal connected to the output terminal ($C_{a\_i}$) of the first counter portion 910, a second input terminal configured to receive the ENABLE signal, and an output terminal connected to clock terminals of the flip-flops. The construction as such of the third counter portion 930 permits the first counter 160 to output the digital code (DC1) to an external temperature measuring instrument, e.g., external temperature measuring instrument 1200 in FIG. 12.

Figure 10:
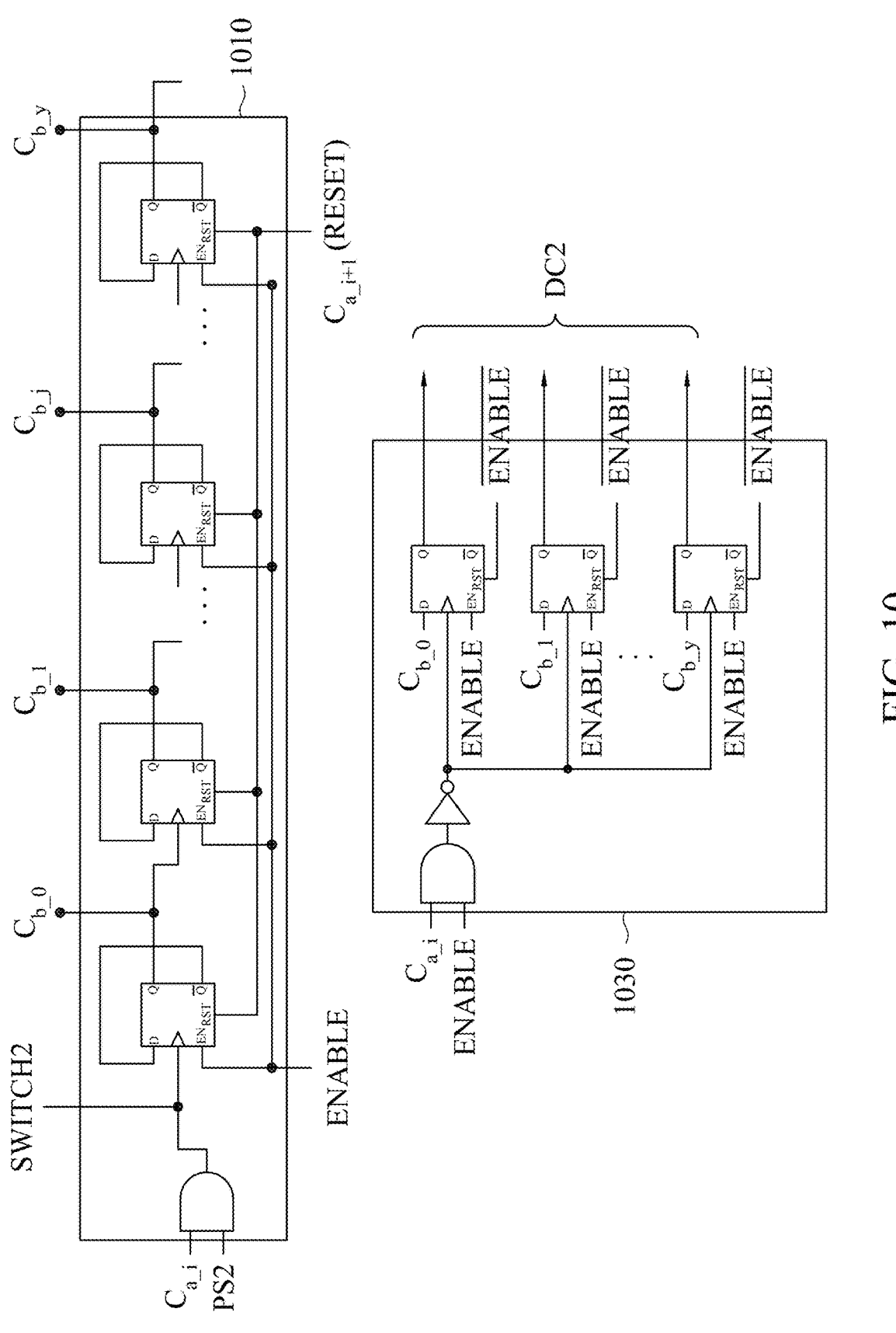
FIG. 10 is a schematic circuit diagram illustrating an exemplary second counter in accordance with various embodiments of the present disclosure.

Example supporting circuitry for the second counter 170 are depicted in FIG. 10. It is understood that these circuitry are provided by way of example, not by limitation, and other second counter 170 circuitry are within the scope of the present disclosure. FIG. 10 is a schematic circuit diagram illustrating an exemplary second counter 170 in accordance with various embodiments of the present disclosure. As illustrated in FIG. 10, the second counter 170 includes a fourth counter portion 1010 and a fifth counter portion 1030. The fourth counter portion 1010 includes a plurality of flip-flops, e.g., d-type flip-flops, and an AND gate. Each of the flip-flops of the fourth counter portion 1010 has an output terminal ($C_{b\_0}$-$C_{b\_y}$). The output terminal ($C_{a\_i+1}$) of the first counter portion 910 is connected to reset terminals of the flip-flops of the fourth counter portion 1010. The AND gate has a first input terminal connected to the pulse signal generator 150 for receiving the pulse signals (PS2) and a second input terminal connected to the output terminal ($C_{a\_i}$) of the first counter portion 910. An output terminal of the AND gate is connected to a clock terminal of a first flip-flop of the fourth counter portion 1010 and the switches (S3, S4) of the pulse signal generator 150. The construction as such of the fourth counter portion 1010 permits the second counter 170 to count/obtain the number of pulse signals (PS2) generated by the pulse signal generator 150, to output the number of pulse signals (PS2) obtained thereby in the form of a series of bits, and to generate the switch signal (SWITCH2).

The fifth counter portion 1030 includes a plurality of flip-flops, e.g., d-type flip-flops, and a NAND gate, e.g., an AND gate and an inverter connected in series. Each of the flip-flops has an input terminal connected to a respective one of the output terminals ($C_{b\_0}$-$C_{b\_y}$) of the fourth counter portion 1010. The NAND gate has a first input terminal connected to the output terminal ($C_{a\_i}$) of the first counter portion 910, a second input terminal configured to receive the ENABLE signal, and an output terminal connected to clock terminals of the flip-flops of the fifth counter portion 1030. The construction as such of the fifth counter portion 1030 permits the second counter 170 to output the digital code (DC2) to an external temperature measuring instrument, e.g., external temperature measuring instrument 1200 in FIG. 12.

Figure 11:
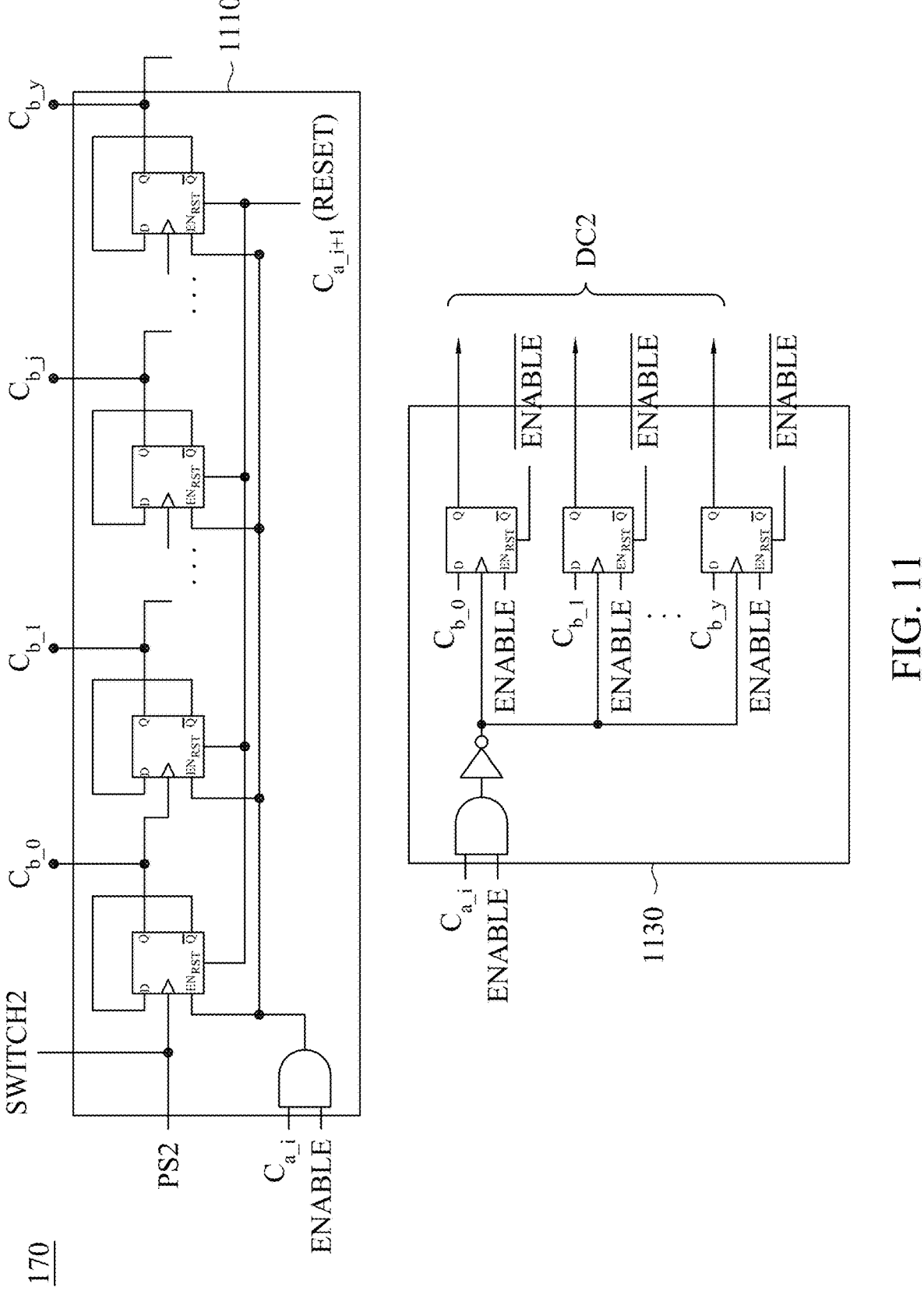
FIG. 11 is a schematic circuit diagram illustrating another exemplary second counter in accordance with various embodiments of the present disclosure.

FIG. 11 is a schematic circuit diagram illustrating another exemplary second counter 170 in accordance with various embodiments of the present disclosure. As illustrated in FIG. 11, the second counter 170 includes a fourth counter portion 1110 and a fifth counter portion 1130. The fourth counter portion 1110 includes a plurality of flip-flops, e.g., d-type flip-flops, and an AND gate. Each of the flip-flops of the fourth counter portion 1110 has an output terminal ($C_{b\_0}$-$C_{b\_y}$). A clock terminal of a first flip-flop of the fourth counter portion 1110 receives the pulse signals (PS2) from the pulse signal generator 150 and is connected to the switches (S3, S4) of the pulse signal generator 150. The output terminal ($C_{a\_i+1}$) of the first counter portion 910 is connected to reset terminals of the flip-flops of the fourth counter portion 1110. The AND gate has a first input terminal connected to the output terminal ($C_{a\_i}$) of the first counter portion 910 and a second input terminal configured to receive the ENABLE signal. An output terminal of the AND gate is connected to enable terminals of the flip-flops of the fourth counter portion 1110. The construction as such of the fourth counter portion 1110 permits the second counter 170 to count/obtain the number of pulse signals (PS2) generated by the pulse signal generator 150, to output the number of pulse signals (PS2) obtained thereby in the form of a series of bits, and to generate the switch signal (SWITCH2).

The fifth counter portion 1130 includes a plurality of flip-flops, e.g., d-type flip-flops, and a NAND gate, e.g., an AND gate and an inverter connected in series. Each of the flip-flops of the fifth counter portion 1130 has an input terminal connected to a respective one of the output terminals ($C_{b\_0}$-$C_{b\_y}$) of the fourth counter portion 1110. The NAND gate has a first input terminal connected to the output terminal ($C_{a\_i}$) of the first counter portion 910, a second input terminal configured to receive the ENABLE signal, and an output terminal connected to clock terminals of the flip-flops of the fifth counter portion 1130. The construction as such of the fifth counter portion 1130 permits the second counter 170 to output the digital code (DC2) to an external temperature measuring instrument, e.g., external temperature measuring instrument 1200 in FIG. 12.

Figure 12:
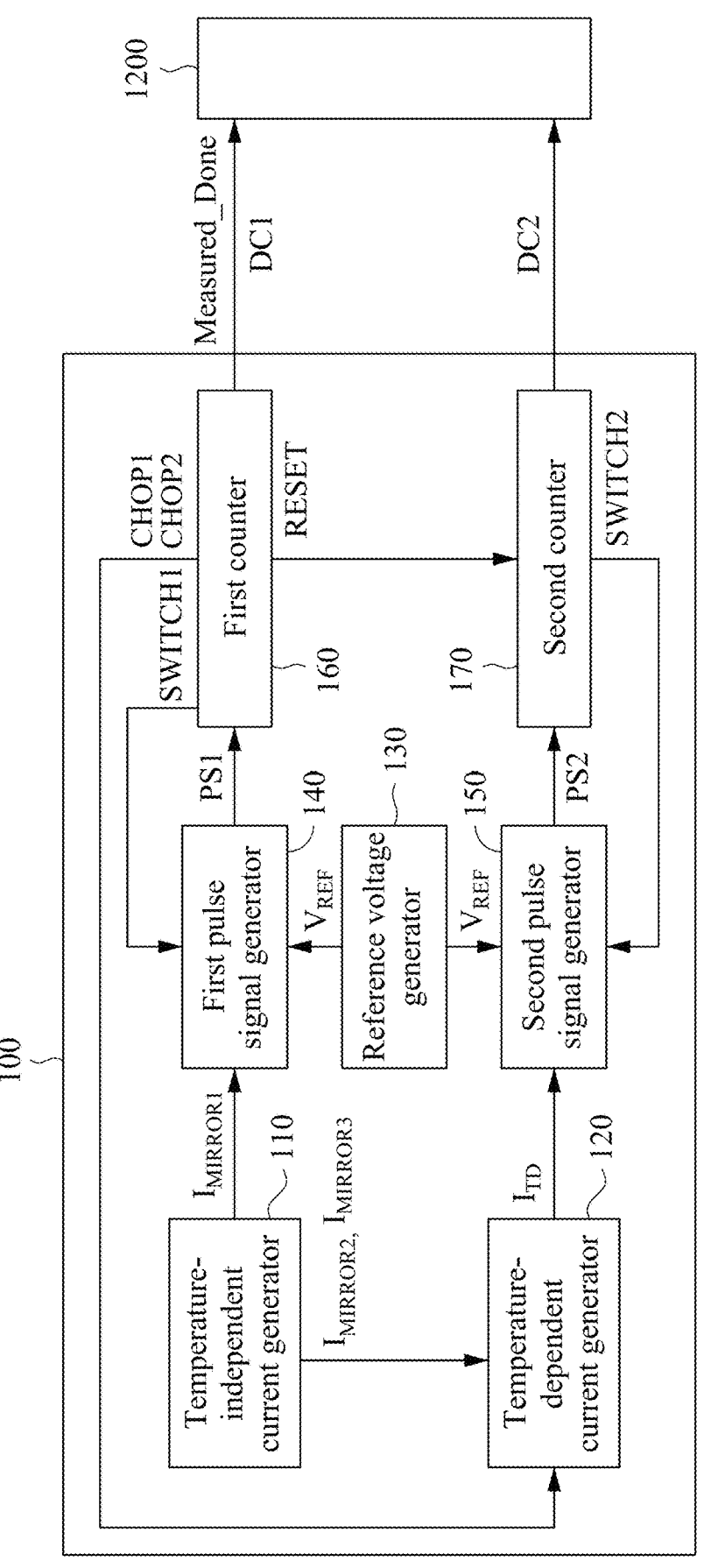
FIG. 12 is a schematic circuit diagram illustrating an exemplary semiconductor device coupled to an external temperature measuring instrument in accordance with various embodiments of the present disclosure.

FIG. 12 is a schematic circuit diagram illustrating an exemplary semiconductor device 100 coupled to an external temperature measuring instrument 1200 in accordance with various embodiments of the present disclosure. As mentioned above, the external temperature measuring instrument 1200 serves to measure a temperature of the semiconductor device 100. For example, as illustrated in FIG. 12, the external temperature measuring instrument 1200 is coupled to the first and second counters 160, 170, e.g., through output pins of the semiconductor device 100, and receives the first and second digital codes (DC1, DC2). The external temperature measuring instrument 1200 has a pre-built lookup table that stores ratios of the second digital codes (DC2) to the first digital codes (DC1) and their corresponding temperature values. The external temperature measuring instrument 1200 receives the first and second digital codes (DC1, DC2), calculates a ratio of the second digital code (DC2) to the first digital code (DC1), and transforms the ratio calculated thereby into a temperature with reference to the pre-built lookup table. After measuring the temperature of the semiconductor device 100, the external temperature measuring instrument 1200 sends a Measured_Done signal to the first counter 160.

In an alternative embodiment, the first counter 160 does not output the digital code (DC1) to the external temperature measuring instrument 1200. In such an alternative embodiment, the external temperature measuring instrument 1200 measures a temperature of the semiconductor device 100 by calculating a ratio of the second digital code (DC2) to a predetermined threshold value and transforms the ratio calculated thereby into a temperature with reference to the pre-built lookup table.

Figure 13:
FIG. 13 is a schematic timing diagram illustrating exemplary signals associated with a semiconductor device in accordance with various embodiments of the present disclosure.
Figure 13:
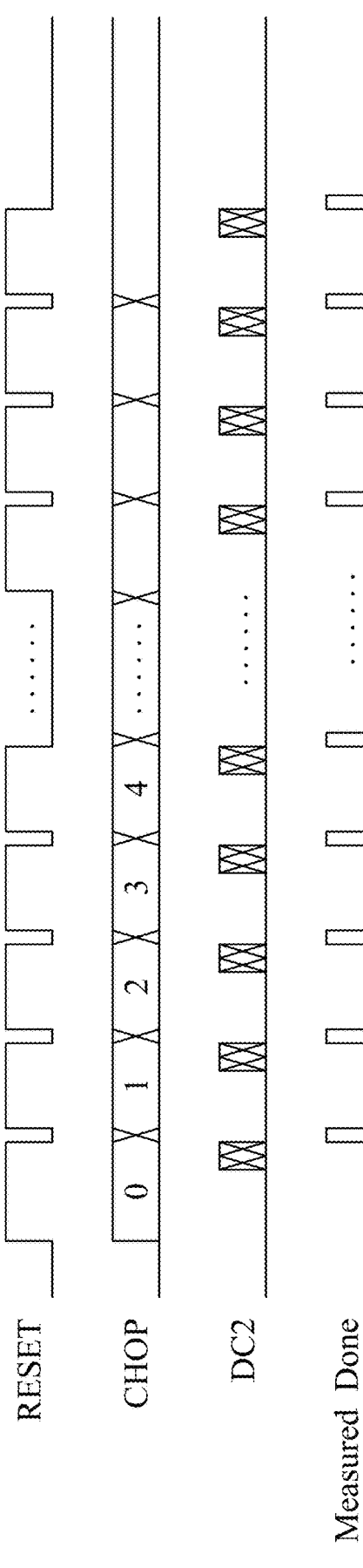

FIG. 13 is a schematic timing diagram illustrating exemplary signals associated with the semiconductor device 100 in accordance with various embodiments of the present disclosure. As illustrated in FIG. 13, the signals associated with the semiconductor device 100 includes a RESET signal, a CHOP signal, a DC2 signal, and a Measured_Done signal. The RESET signal is generated by the first counter 160 to reset the digital code (DC1) thereof and the digital code (DC2) of the second counter 170 to zero. The CHOP signal is generated by the first counter 160 to reverse a polarity of the current mismatch correction circuit 530 or a polarity of the voltage offset correction circuit 540. The DC2 signal is the digital code (DC2) provided as an output by the second counter 170 to the external temperature measuring instrument 1200. The Measured_Done signal is received by the first counter 160 from the external temperature measuring instrument 1200 after a temperature of the semiconductor device 100 is measured by the external temperature measuring instrument 1200.

As illustrated in FIG. 13, the second counter 170 outputs the digit code (DC2), indicated by a series of high and low signal levels of the DC2 signal. A Measured_Done signal that has a high signal level is then received by the first counter 160. The first counter 160 subsequently generates a RESET signal that transitions from a low signal level to a high signal level so as to reset the digital code (DC1) thereof and the digital code (DC2) of the second counter 170 to zero. Thereafter, the first counter 160 generates a CHOP signal, e.g., chop signal (CHOP1 or CHOP2), that has a low/high signal level for reversing a polarity of the current mismatch correction circuit 530 or a polarity of the voltage offset correction circuit 540.

Figure 14:
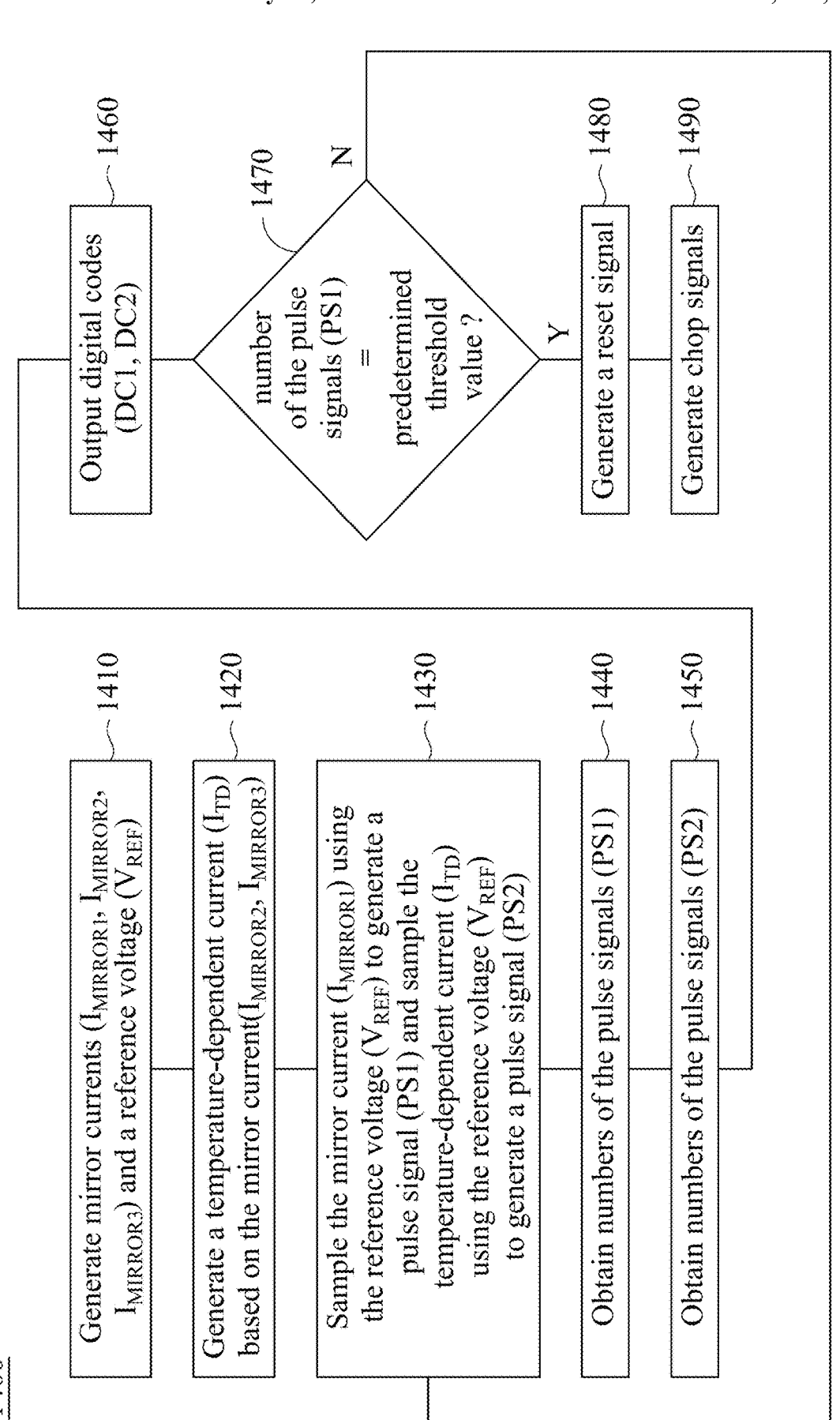
FIG. 14 is a flow chart illustrating an exemplary method of monitoring a temperature of a semiconductor device in accordance with various embodiments of the present disclosure.

FIG. 14 is a flow chart illustrating an exemplary method 1400 of monitoring a temperature of a semiconductor device in accordance with various embodiments of the present disclosure. Method 1400 will now be described with further reference to FIGS. 1, 2, 3A, 3B, 5, 9, and 10 for ease of understanding. It is understood that method 1400 is applicable to structures other than those of FIGS. 1, 2, 3A, 3B, 5, 9, and 10. Further, it is understood that additional operations can be provided before, during, and after method 1400, and some of the operations described below can be replaced or eliminated, in an alternative embodiment of method 1400.

In operation 1410, the temperature-independent current generator 110 generates mirror currents ($I_{MIRROR1}$-$I_{MIRROR3}$) and the reference voltage generator 130 generates a reference voltage ($V_{REF}$).

In operation 1420, the temperature-dependent current generator 120 generates a temperature-dependent current ($I_{TD}$) based on the mirror currents ($I_{MIRROR2}$, $I_{MIRROR3}$).

In operation 1430, the first pulse signal generator 140 samples the current ($I_{MIRROR1}$) using the reference voltage ($V_{REF}$) so as to generate a pulse signal (PS1) and the second pulse signal generator 150 samples the temperature-dependent current ($I_{TD}$) using the reference voltage ($V_{REF}$) so as to generate a pulse signal (PS2).

In operation 1440, the first counter 160 counts/obtains the number of pulse signals (PS1) generated in operation 1430.

In operation 1450, the second counter 170 counts/obtains the number of pulse signals (PS2) generated in operation 1430.

In operation 1460, the first counter 160 outputs a digital code (DC1) indicative of the number of pulse signals (PS1) obtained thereby and the second counter 170 outputs a digital code (DC2) indicative of the number of pulse signals (PS2) obtained thereby.

In operation 1470, the first counter 160 determines whether the number of pulse signals (PS1) obtained thereby is equal to a predetermined threshold value. If it is determined that the number of pulse signals (PS1) is not equal to a predetermined threshold value, i.e., the first counter 160 determines that the number of pulse signals (PS1) obtained thereby is less than the predetermined threshold value, the flow goes back to operation 1430. Otherwise, i.e., the first counter 160 determines that the number of pulse signals (PS1) obtained thereby is equal to the predetermined threshold value, the flow proceeds to operation 1480.

In operation 1480, the first counter 160 generates a reset signal (RESET) to reset the number of pulse signals (PS1) obtained thereby and the number of pulse signals (PS2) obtained by the second counter 160 to zero.

In operation 1490, the first counter 160 generates chop signals (CHOP1, CHOP2) for reception by the current mismatch correction circuit 530 and the voltage offset correction circuit 540 and for reversing a polarity of the current mismatch correction circuit 530 and a polarity of the voltage offset correction circuit 540, respectively. Thereafter, operations 1430 to 1490 are repeated for a predetermined number of times.

Figure 15:
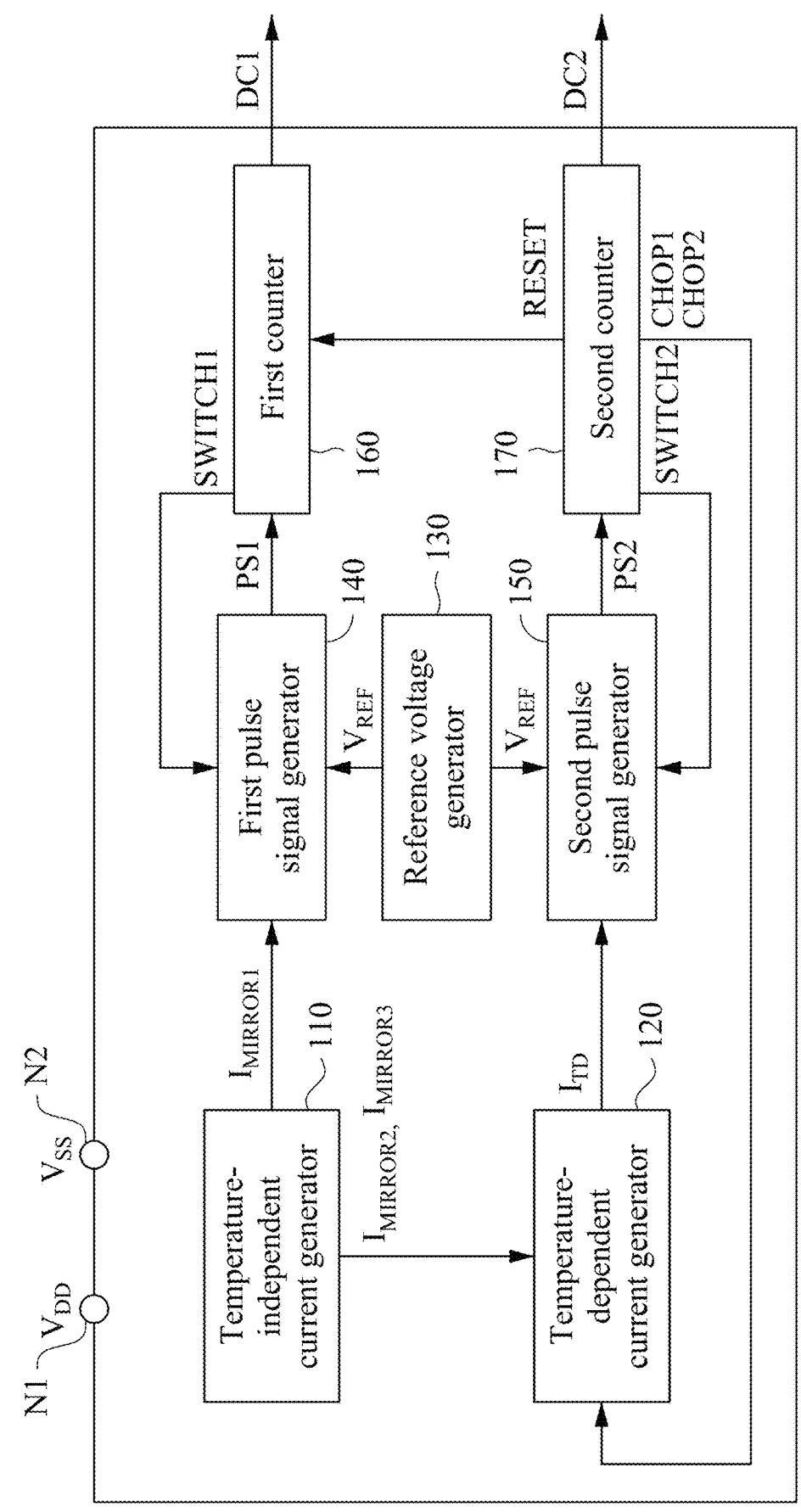
FIG. 15 is a schematic block diagram illustrating another exemplary semiconductor device in accordance with various embodiments of the present disclosure.

FIG. 15 is a schematic block diagram illustrating another exemplary semiconductor device 1500 in accordance with various embodiments of the present disclosure. The semiconductor device 1500 of this embodiment differs from the semiconductor device 100 in that, instead of the first counter 160, the second counter 170 of the semiconductor device 1000 determines whether the number of pulse signals (PS2) obtained thereby is less than or equal to a predetermined threshold value, permits the second pulse signal generator 150 to generate a pulse signal when it is determined thereby that the number of pulse signals (PS2) obtained thereby is less than the predetermined threshold value, and inhibits the second pulse signal generator 150 from generating a pulse signal when it is determined thereby that the number of pulse signals (PS2) obtained thereby is equal to the predetermined threshold value.

The second counter 170 of the semiconductor device 1500 further generates chop signals (CHOP1, CHOP2) for reception by the current mismatch correction circuit 530 and the voltage offset correction circuit 540 and for reversing a polarity of the current mismatch correction circuit 530 and a polarity of the voltage offset correction circuit 540, respectively. The second counter 170 of the semiconductor device 1500 further generates a reset signal (RESET) for resetting the number of pulse signals (PS2) obtained thereby and the number of pulse signals (PS1) obtained by the first counter 160 to zero.

Figure 16:
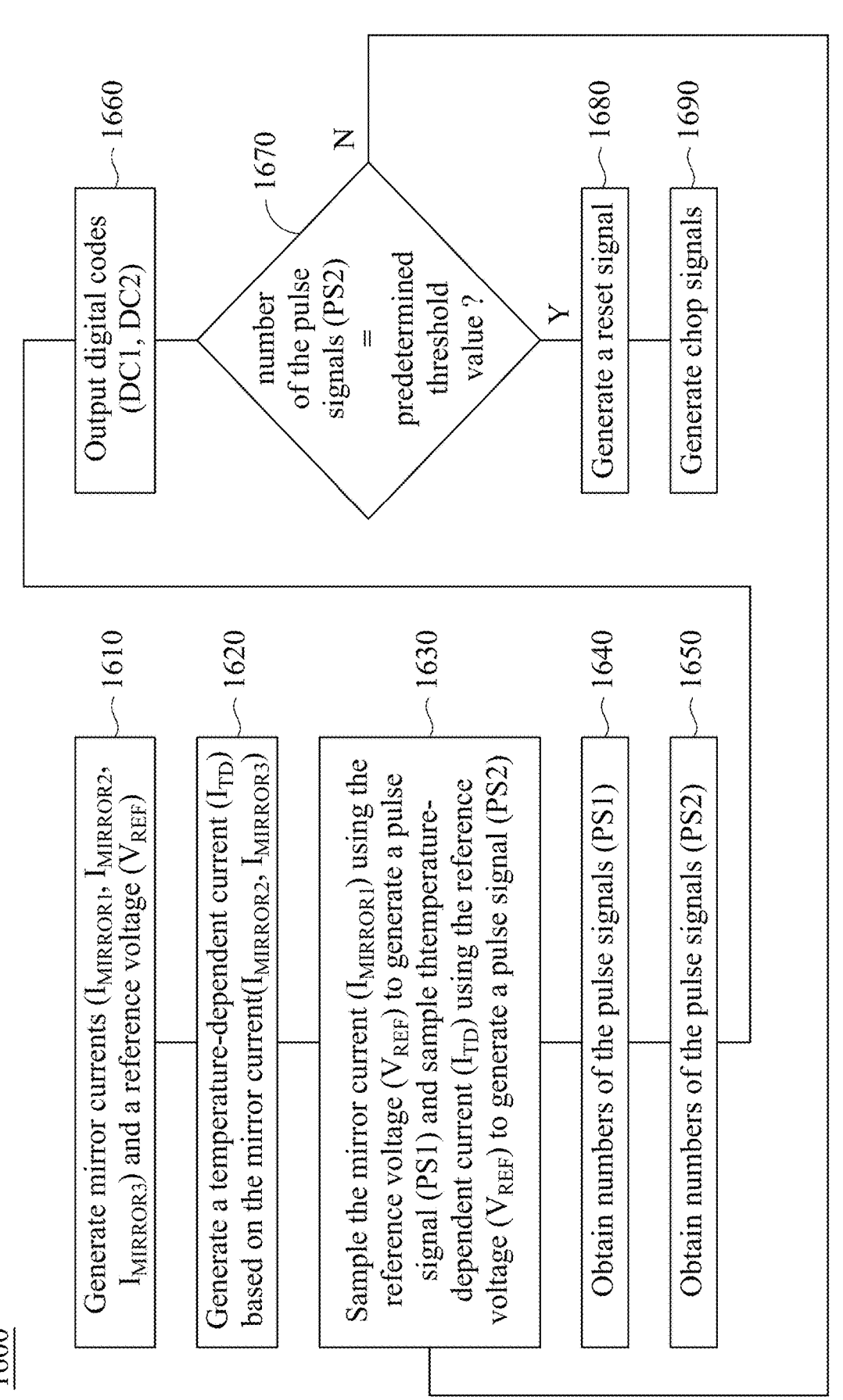
FIG. 16 is a flow chart illustrating another exemplary method of monitoring a temperature of a semiconductor device in accordance with various embodiments of the present disclosure.

FIG. 16 is a flow chart illustrating an exemplary method 1600 of monitoring a temperature of a semiconductor device in accordance with various embodiments of the present disclosure. Method 1600 will now be described with further reference to FIGS. 2, 3A, 3B, 5, and 15 for ease of understanding. It is understood that method 1600 is applicable to structures other than those of FIGS. 2, 3A, 3B, 5, and 15. Further, it is understood that additional operations can be provided before, during, and after method 1600, and some of the operations described below can be replaced or eliminated, in an alternative embodiment of method 1600.

In operation 1610, the temperature-independent current generator 110 generates mirror currents ($I_{MIRROR1}$-$I_{MIRROR3}$) and the reference voltage generator 130 generates a reference voltage ($V_{REF}$).

In operation 1620, the temperature-dependent current generator 120 generates a temperature-dependent current ($I_{TD}$) based on the mirror currents ($I_{MIRROR2}$, $I_{MIRROR3}$).

In operation 1630, the first pulse signal generator 140 samples the mirror current ($I_{MIRROR1}$) using the reference voltage ($V_{REF}$) so as to generate a pulse signal (PS1) and the second pulse signal generator 150 samples the temperature-dependent current ($I_{TD}$) using the reference voltage ($V_{REF}$) so as to generate a pulse signal (PS2).

In operation 1640, the first counter 160 counts/obtains the number of pulse signal (PS1) generated in operation 1630.

In operation 1650, the second counter 170 counts/obtains the number of pulse signals (PS2) generated in operation 1630.

In operation 1660, the first counter 160 outputs a digital code (DC1) indicative of the number of pulse signals (PS1) obtained thereby and the second counter 170 outputs a digital code (DC2) indicative of the number of pulse signals (PS2) obtained thereby.

In operation 1670, the second counter 170 determines whether the number of pulse signals (PS2) obtained thereby is equal to a predetermined threshold value. If it is determined that the number of pulse signals (PS2) is not equal to a predetermined threshold value, i.e., the second counter 170 determines that the number of pulse signals (PS2) obtained thereby is less than the predetermined threshold value, the flow goes back to operation 1630. Otherwise, i.e., the second counter 170 determines that the number of pulse signals (PS2) obtained thereby is equal to the predetermined threshold value, the flow proceeds to operation 1680.

In operation 1680, the second counter 170 generates a reset signal (RESET) to reset the number of pulse signals (PS1) obtained by the first counter 160 and the number of pulse signals (PS2) obtained thereby to zero.

In operation 1690, the second counter 170 generates chop signals (CHOP1, CHOP2) for reception by the current mismatch correction circuit 530 and the voltage offset correction circuit 540 and for reversing a polarity of the current mismatch correction circuit 530 and a polarity of the voltage offset correction circuit 540, respectively. Thereafter, operations 1630 to 1690 are repeated for a predetermined number of times.

In an embodiment, a semiconductor device comprises a temperature-independent current generator, a pulse signal generator, and a counter. The temperature-independent current generator is configured to generate a reference current substantially independent of temperature and a mirror current that is a substantial duplicate of the reference current. The pulse signal generator is coupled to the temperature-independent current generator and is configured to sample the mirror current so as to generate a pulse signal. The counter is coupled to the pulse signal generator and is configured to obtain a number of pulse signals generated by the pulse signal generator, to permit the pulse signal generator to generate a pulse signal when it is determined thereby that the number of pulse signals obtained thereby is less than a predetermined threshold value, and to inhibit the pulse signal generator from generating a pulse signal when it is determined thereby that the number of pulse signals obtained thereby is equal to the predetermined threshold value.

In another embodiment, a semiconductor device comprises a temperature-dependent current generator, a pulse signal generator, and a counter. The temperature-dependent current generator is configured to generate a temperature-dependent current dependent of temperature. The pulse signal generator is coupled to the temperature-dependent current generator and is configured to sample the temperature-dependent current so as to generate a pulse signal. The counter is coupled to the pulse signal generator and is configured to obtain a number of pulse signals generated by the pulse signal generator, to permit the pulse signal generator to generate a pulse signal when it is determined thereby that the number of pulse signals obtained thereby is less than a predetermined threshold value, and to inhibit the pulse signal generator from generating a pulse signal when it is determined thereby that the number of the pulse signals obtained thereby is equal to the predetermined threshold value.

In another embodiment, a method of monitoring a temperature of a semiconductor device comprises: generating a reference current substantially independent of temperature; duplicating the reference current to generate first, second, and third mirror currents; sampling the first mirror current to generate first pulse signals; counting a number of the first pulse signals to generate a first digital code; generating a temperature-dependent current dependent of temperature based on the second and third mirror currents; sampling the temperature-dependent current to generate second pulse signals; and counting a number of the second pulse signals to generate a second digital code, whereby the temperature of the semiconductor device is monitored using the first and second digital codes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device comprising:
   a temperature-independent current generator configured to generate a reference current substantially independent of temperature and a first current, a second current, and a third current that are substantial duplicates of the reference current;

a temperature-dependent current generator configured to generate a temperature-dependent current based on the second current and the third current received thereby; and a first counter responsive to the first current and configured to generate a first chop signal, wherein the temperature-dependent current generator is configured to reduce a current mismatch between the second current and the third current responsive to the first chop signal.

2. The semiconductor device of claim 1, further comprising a first pulse signal generator, including:

a first switch coupled between the temperature-independent current generator and a node;

a second switch coupled to the node;

a capacitor coupled in parallel with the second switch; and a comparator having a first comparator input coupled to the node, a second comparator input configured to receive a reference voltage, and a comparator output coupled to the first counter.

3. The semiconductor device of claim 1, wherein the temperature-independent current generator is further configured:

to generate a proportional to absolute temperature (PTAT) current and a complementary to absolute temperature (CTAT) current; and to combine the PTAT current and the CTAT so as to generate the reference current.

4. The semiconductor device of claim 1, further comprising:

a first pulse signal generator coupled to the temperature-independent current generator and configured to sample the first current so as to generate a pulse signal, wherein the first counter is coupled to the first pulse signal generator and configured to obtain a number of pulse signals generated by the first pulse signal generator;

a second pulse signal generator coupled to the temperature-dependent current generator and configured to sample the temperature-dependent current so as to generate a second pulse signal; and a second counter coupled to the second pulse signal generator and configured to count a number of second pulse signals generated by the second pulse signal generator.

5. The semiconductor device of claim 4, wherein the second pulse signal generator includes:

a first switch coupled between the temperature-dependent current generator and a node;

a second switch coupled to the node;

a capacitor coupled in parallel with the second switch; and a comparator having a first comparator input coupled to the node, a second comparator input configured to receive a reference voltage, and a comparator output coupled to the second counter.

6. The semiconductor device of claim 1, wherein the temperature-dependent current generator is further configured:

to generate one of a PTAT voltage and a CTAT voltage based on the second current;

to convert the one of the PTAT voltage and the CTAT voltage into the one of a PTAT current and a CTAT current; and to subtract the one of the PTAT current and the CTAT current from the third current so as to extract the temperature-dependent current.

7. The semiconductor device of claim 1, wherein the temperature-dependent current generator further includes a current mismatch correction circuit configured to reduce a current mismatch and the first counter is configured to generate the first chop signal for reception by and for periodically reversing a polarity of the current mismatch correction circuit.

8. The semiconductor device of claim 1, wherein the temperature-dependent current generator further includes a voltage offset correction circuit configured to reduce a voltage offset and the first counter is further configured to generate a second chop signal for reception by and for periodically reversing a polarity of the voltage offset correction circuit.

9. The semiconductor device of claim 1, wherein the temperature-dependent current generator includes:

an operational amplifier coupled between first and second nodes;

a first element coupled to the first node; and a second element coupled to the second node, wherein the first element has a negative temperature coefficient.

10. The semiconductor device of claim 1, wherein the temperature-dependent current generator includes:

an operational amplifier coupled between first and second nodes;

a first element coupled to the first node; and a second element coupled to the second node, wherein the first element has a positive temperature coefficient.

11. The semiconductor device of claim 1, wherein the temperature-dependent current generator includes:

an operational amplifier having a first input configured to receive the second current;

a first resistor coupled between the first input of the operational amplifier and an electrical ground;

a second resistor coupled between a second input of the operational amplifier and the electrical ground; and a transistor configured to receive the third current and coupled between the second input and an output of the operational amplifier.

12. The semiconductor device of claim 1, wherein the temperature-dependent current generator includes:

an operational amplifier having a first input configured to receive the second current;

a first transistor or a diode coupled between the first input of the operational amplifier and an electrical ground;

a resistor coupled between a second input of the operational amplifier and the electrical ground; and a second transistor configured to receive the third current and coupled between the second input and an output of the operational amplifier.

13. A semiconductor device comprising:

a temperature-dependent current generator configured to:

receive a first current, a second current, and a third current which are generated by a temperature-independent current generator and substantially independent of temperature; and generate a temperature-dependent current dependent of temperature based on the second current and the third current; and a first counter responsive to the first current and configured to generate a first chop signal, wherein the temperature-dependent current generator is configured to reduce a current mismatch between the second current and the third current responsive to the first chop signal.

14. The semiconductor device of claim 13, further comprising:

a second pulse signal generator coupled to the temperature-dependent current generator and configured to sample the temperature-dependent current so as to generate a pulse signal; and a second counter coupled to the second pulse signal generator and configured to obtain a number of pulse signals generated by the second pulse signal generator.

15. The semiconductor device of claim 13, wherein the temperature-dependent current generator further includes a current mismatch correction circuit configured to reduce a current mismatch and the first counter is configured to generate the first chop signal for reception by and for periodically reversing a polarity of the current mismatch correction circuit.

16. The semiconductor device of claim 13, wherein the temperature-dependent current generator further includes a voltage offset correction circuit configured to reduce a voltage offset and the first counter is further configured to generate a second chop signal for reception by and for periodically reversing a polarity of the voltage offset correction circuit.

17. A method of monitoring a temperature of a semiconductor device, comprising:

generating, by a temperature-independent current generator, a reference current substantially independent of temperature, and first, second, and third currents that are substantial duplicates of the reference current; and generating, by a temperature-dependent current generator, a temperature-dependent current dependent of temperature based on the second and third currents received thereby;

generating, by a first counter, a chop signal responsive to the first current; and reducing, by the temperature-dependent current generator, a current mismatch between the second and third currents responsive to the chop signal.

18. The method of claim 17, further comprising:

sampling the first current to generate first pulse signals;

counting a number of the first pulse signals to generate a first digital code;

sampling the temperature-dependent current to generate second pulse signals; and counting a number of the second pulse signals to generate a second digital code, whereby a temperature of the semiconductor device is monitored using the first and second digital codes.

19. The method of claim 17, further comprising:

generating a CTAT voltage based on the second current;

converting the CTAT voltage to a CTAT current; and subtracting the CTAT current from the third current to extract the temperature-dependent current.

20. The method of claim 17, further comprising:

generating a PTAT voltage based on the second current;

converting the PTAT voltage to a PTAT current; and subtracting the PTAT current from the third current to extract the temperature-dependent current.

* * * * *